(12) United States Patent
Lin et al.

(10) Patent No.: US 12,354,989 B2
(45) Date of Patent: Jul. 8, 2025

(54) PACKAGE STRUCTURE WITH CONDUCTIVE VIA STRUCTURE

(71) Applicant: TAIWAN SEMICONDUCTOR MANUFACTURING COMPANY, LTD., Hsinchu (TW)

(72) Inventors: Meng-Liang Lin, Hsinchu (TW); Po-Yao Chuang, Hsin-Chu (TW); Shin-Puu Jeng, Hsinchu (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 0 days.

(21) Appl. No.: 18/488,440

(22) Filed: Oct. 17, 2023

(65) Prior Publication Data

US 2024/0047401 A1    Feb. 8, 2024

Related U.S. Application Data

(62) Division of application No. 17/411,701, filed on Aug. 25, 2021, now Pat. No. 12,057,424.

(Continued)

(51) Int. Cl.
*H01L 23/00* (2006.01)
*H01L 23/538* (2006.01)
(Continued)

(52) U.S. Cl.
CPC .......... *H01L 24/16* (2013.01); *H01L 23/5383* (2013.01); *H01L 25/0652* (2013.01); *H01L 25/0657* (2013.01); *H01L 25/18* (2013.01); *H01L 25/50* (2013.01); *H01L 23/13* (2013.01); *H01L 23/49811* (2013.01); *H01L 23/49833* (2013.01); *H01L 24/73* (2013.01); *H01L 2224/16057* (2013.01); *H01L 2224/16238* (2013.01); *H01L 2224/16501* (2013.01);
(Continued)

(58) Field of Classification Search
None
See application file for complete search history.

(56) References Cited

U.S. PATENT DOCUMENTS 9,000,584 B2    4/2015    Lin et al.
9,048,222 B2    6/2015    Hung et al.
(Continued)

FOREIGN PATENT DOCUMENTS

TW    201203483 A1    1/2012
TW    201810458 A     3/2018
TW    201919165 A     5/2019

*Primary Examiner* — Hung K Vu
(74) *Attorney, Agent, or Firm* — Birch, Stewart, Kolasch & Birch, LLP

(57) ABSTRACT

A package structure is provided. The package structure includes an interposer substrate including an insulating structure, a conductive pad, a first conductive line, and a first conductive via structure. The package structure includes an electronic device bonded to the conductive pad. The package structure includes a chip structure bonded to the first end portion of the first conductive via structure. The package structure includes a first conductive bump connected between the chip structure and the first end portion of the first conductive via structure. The first end portion protrudes into the first conductive bump and is in direct contact with the first conductive bump.

20 Claims, 32 Drawing Sheets

Related U.S. Application Data

(60) Provisional application No. 63/188,132, filed on May 13, 2021.

(51) Int. Cl.
  *H01L 25/00* (2006.01)
  *H01L 25/065* (2023.01)
  *H01L 25/18* (2023.01)
  *H01L 23/13* (2006.01)
  *H01L 23/498* (2006.01)

(52) U.S. Cl.
  CPC ............. *H01L 2224/73204* (2013.01); *H01L 2225/06517* (2013.01); *H01L 2225/06572* (2013.01)

(56) References Cited

U.S. PATENT DOCUMENTS

| | | |
|---|---|---|
| 9,048,233 B2 | 6/2015 | Wu et al. |
| 9,064,879 B2 | 6/2015 | Hung et al. |
| 9,111,949 B2 | 8/2015 | Yu et al. |
| 9,263,511 B2 | 2/2016 | Yu et al. |
| 9,281,254 B2 | 3/2016 | Yu et al. |
| 9,368,460 B2 | 6/2016 | Yu et al. |
| 9,372,206 B2 | 6/2016 | Wu et al. |
| 9,496,189 B2 | 11/2016 | Yu et al. |
| 9,653,443 B2 * | 5/2017 | Cheng ................. H01L 23/5389 |
| 2007/0152331 A1 * | 7/2007 | Kang ..................... C22C 30/06 |
| | | 257/772 |
| 2017/0263545 A1 | 9/2017 | Tsukamoto et al. |
| 2022/0052006 A1 * | 2/2022 | Kang ..................... H01L 24/14 |

* cited by examiner

PACKAGE STRUCTURE WITH CONDUCTIVE VIA STRUCTURE

PRIORITY CLAIM AND CROSS-REFERENCE

This application is a Divisional of U.S. application Ser. No. 17/411,701, filed on Aug. 25, 2021, which claims the benefit of U.S. Provisional Application No. 63/188,132, filed on May 13, 2021, and entitled "CHIP PACKAGE STRUCTURE AND METHOD FOR FORMING THE SAME", the entirety of which is incorporated by reference herein.

BACKGROUND

Semiconductor devices are used in a variety of electronic applications, such as personal computers, cell phones, digital cameras, and other electronic equipment. Semiconductor devices are typically fabricated by sequentially depositing insulating or dielectric layers, conductive layers, and semiconductor layers over a semiconductor substrate, and patterning the various material layers using lithography processes and etching processes to form circuit components and elements.

Dozens or hundreds of integrated circuits are typically manufactured on a single semiconductor wafer. The individual dies are singulated by sawing the integrated circuits along scribe lines. The individual dies are then packaged separately. The semiconductor industry continues to improve the integration density of various electronic components (e.g., transistors, diodes, resistors, capacitors, etc.) by continual reductions in minimum feature size, which allow more components to be integrated into a given area. However, since feature sizes continue to decrease, fabrication processes continue to become more difficult to perform. Therefore, it is a challenge to form reliable packages with electronic components with high integration density.

BRIEF DESCRIPTION OF THE DRAWINGS

Aspects of the present disclosure are best understood from the following detailed description when read with the accompanying figures. It should be noted that, in accordance with standard practice in the industry, various features are not drawn to scale. In fact, the dimensions of the various features may be arbitrarily increased or reduced for clarity of discussion.

FIG. 1J-1 is an enlarged cross-sectional view of a region of the package structure of FIG. 1J, in accordance with some embodiments.

FIG. 2E-1 is an enlarged cross-sectional view of a region of the package structure of FIG. 2E, in accordance with some embodiments.

FIG. 4D-1 is an enlarged cross-sectional view of a region of the package structure of FIG. 4D, in accordance with some embodiments.

DETAILED DESCRIPTION

Figure 1A:
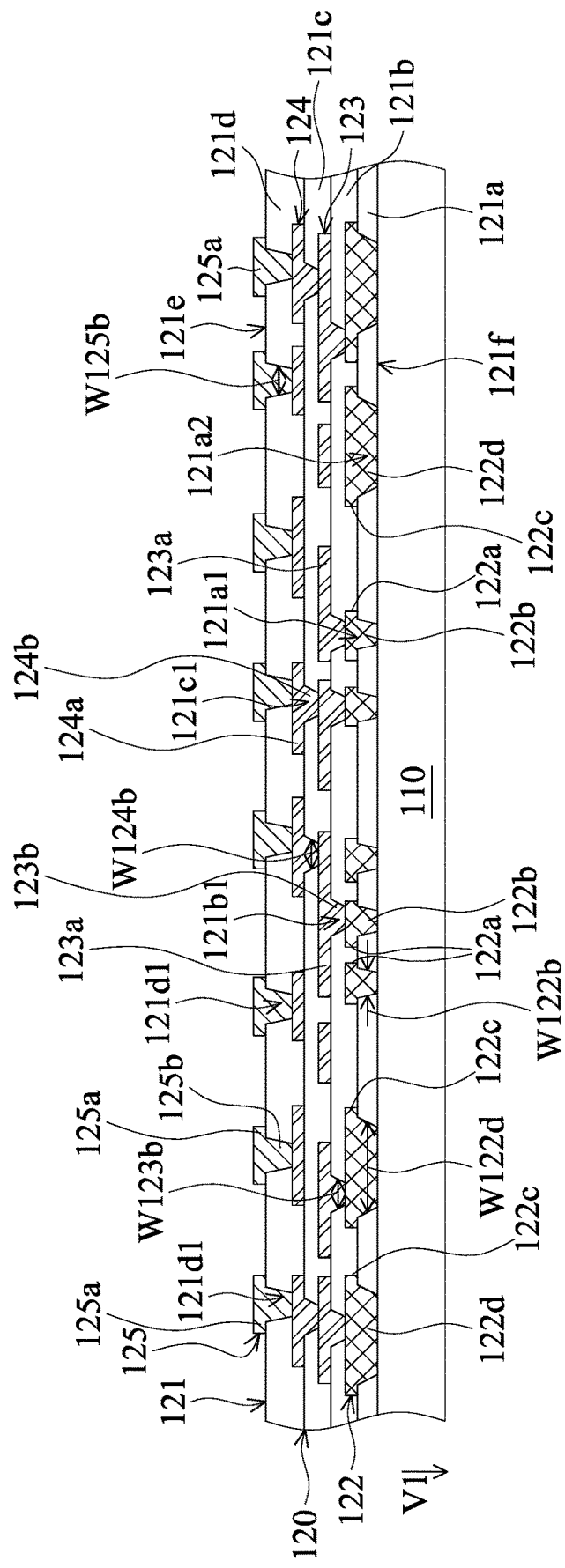
FIGS. 1A-1L are cross-sectional views of various stages of a process for forming a package structure, in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Furthermore, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The term "substantially" in the description, such as in "substantially flat" or in "substantially coplanar", etc., will be understood by the person skilled in the art. In some embodiments the adjective substantially may be removed. Where applicable, the term "substantially" may also include embodiments with "entirely", "completely", "all", etc. The term "substantially" may be varied in different technologies and be in the deviation range understood by the skilled in the art. For example, the term "substantially" may also relate to 90% of what is specified or higher, such as 95% of what is specified or higher, especially 99% of what is specified or higher, including 100% of what is specified, though the present invention is not limited thereto. Furthermore, terms such as "substantially parallel" or "substantially perpendicular" may be interpreted as not to exclude insignificant deviation from the specified arrangement and may include for example deviations of up to 10°. The word "substantially" does not exclude "completely" e.g. a composition which is "substantially free" from Y may be completely free from Y.

The term "about" may be varied in different technologies and be in the deviation range understood by the skilled in the art. The term "about" in conjunction with a specific distance or size is to be interpreted so as not to exclude insignificant deviation from the specified distance or size. For example, the term "about" may include deviations of up to 10% of what is specified, though the present invention is not limited thereto. The term "about" in relation to a numerical value x may mean x±5 or 10% of what is specified, though the present invention is not limited thereto.

Some embodiments of the disclosure are described. Additional operations can be provided before, during, and/or after the stages described in these embodiments. Some of the stages that are described can be replaced or eliminated for different embodiments. Additional features can be added to the semiconductor device structure. Some of the features described below can be replaced or eliminated for different embodiments. Although some embodiments are discussed with operations performed in a particular order, these operations may be performed in another logical order.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIGS. 1A-1L are cross-sectional views of various stages of a process for forming a package structure, in accordance with some embodiments. As shown in FIG. 1A, a carrier substrate 110 is provided, in accordance with some embodiments. The carrier substrate 110 is configured to provide temporary mechanical and structural support during subsequent processing steps, in accordance with some embodiments.

The carrier substrate 110 includes glass, silicon, silicon oxide, aluminum oxide, metal, a combination thereof, and/or the like, in accordance with some embodiments. The carrier substrate 110 includes a metal frame, in accordance with some embodiments.

As shown in FIG. 1A, an interposer substrate 120 is formed over the carrier substrate 110, in accordance with some embodiments. The formation of the interposer substrate 120 includes forming an insulating layer 121a over the carrier substrate 110; forming a wiring layer 122 over the insulating layer 121a and in through holes 121a1 and 121a2 of the insulating layer 121a; forming an insulating layer 121b over the insulating layer 121a and the wiring layer 122; forming a wiring layer 123 over the insulating layer 121b and in through holes 121b1 of the insulating layer 121b; forming an insulating layer 121c over the insulating layer 121b and the wiring layer 123; forming a wiring layer 124 over the insulating layer 121c and in through holes 121c1 of the insulating layer 121c; forming an insulating layer 121d over the insulating layer 121c and the wiring layer 124; and forming a wiring layer 125 over the insulating layer 121d and in through holes 121d1 of the insulating layer 121d.

The insulating layers 121a, 121b, 121c, and 121d together form an insulating structure 121, in accordance with some embodiments. The insulating structure 121 has two opposite surfaces 121e and 121f, in accordance with some embodiments. The wiring layers 122, 123, 124, and 125 are electrically connected to each other, in accordance with some embodiments.

The wiring layer 122 includes conductive lines 122a and 122c and conductive via structures 122b and 122d, in accordance with some embodiments. The conductive lines 122a and 122c are over the insulating layer 121a, in accordance with some embodiments. The conductive via structures 122b and 122d pass through the insulating layer 121a, in accordance with some embodiments. The conductive via structures 122b and 122d are respectively under and connected to the conductive lines 122a and 122c, in accordance with some embodiments.

The width W122b of each conductive via structure 122b decreases in a direction V1 away from the surface 121e of the insulating structure 121, in accordance with some embodiments. The width W122d of each conductive via structure 122d decreases in the direction V1 away from the surface 121e of the insulating structure 121, in accordance with some embodiments.

The conductive via structure 122d is wider than the conductive via structure 122b, in accordance with some embodiments. The width W122d is greater than the width W122b when the widths W122b and W122d are measured at the same level, in accordance with some embodiments.

The wiring layer 123 includes conductive lines 123a and conductive via structures 123b, in accordance with some embodiments. The conductive lines 123a are over the insulating layer 121b, in accordance with some embodiments. The conductive via structures 123b pass through the insulating layer 121b, in accordance with some embodiments. The conductive via structures 123b are under and connected to the conductive lines 123a, in accordance with some embodiments. The width W123b of each conductive via structure 123b decreases in the direction V1 away from the surface 121e of the insulating structure 121, in accordance with some embodiments.

The wiring layer 124 includes conductive lines 124a and conductive via structures 124b, in accordance with some embodiments. The conductive lines 124a are over the insulating layer 121c, in accordance with some embodiments. The conductive via structures 124b pass through the insulating layer 121c, in accordance with some embodiments. The conductive via structures 124b are under and connected to the conductive lines 124a, in accordance with some embodiments. The width W124b of each conductive via structure 124b decreases in the direction V1 away from the surface 121e of the insulating structure 121, in accordance with some embodiments.

The wiring layer 125 includes conductive pads 125a, conductive lines (not shown), and conductive via structures 125b, in accordance with some embodiments. The conductive pads 125a and the conductive lines are over the insulating layer 121d and connected to each other, in accordance with some embodiments. The conductive via structures 125b pass through the insulating layer 121d, in accordance with some embodiments.

The conductive via structures 125b are under and connected to the conductive pads 125a and the conductive lines, in accordance with some embodiments. The width W125b of each conductive via structure 125b decreases in the direction V1 away from the surface 121e of the insulating structure 121, in accordance with some embodiments. In some other embodiments, the conductive lines are not formed.

The insulating structure 121 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments. The wiring layers 122, 123, 124, and 125 are made of a conductive material, such as metal (e.g. copper, aluminum, or tungsten), in accordance with some embodiments.

Figure 1B:
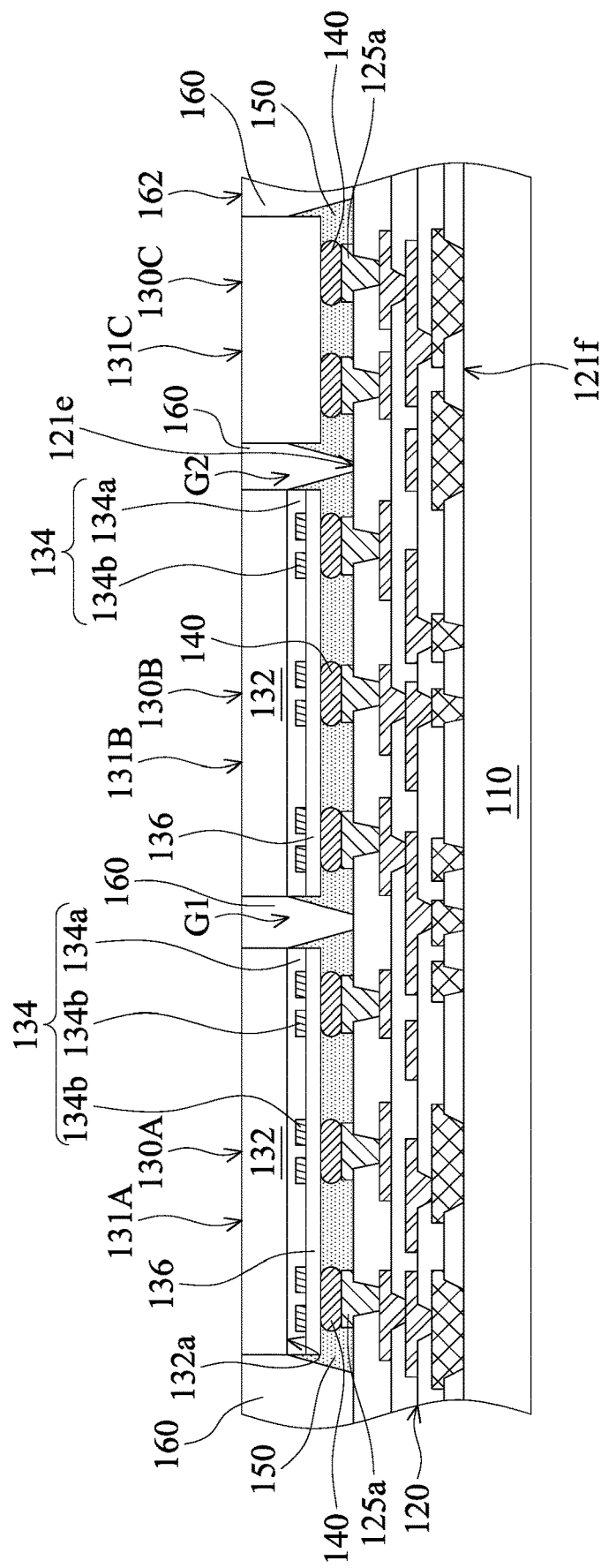

As shown in FIG. 1B, chip structures 130A and 130B and an electronic device 130C are bonded to the interposer substrate 120 through conductive bumps 140, in accordance with some embodiments. Each of the chip structures 130A and 130B includes a system-on-chip (SoC) structure, a memory chip structure (e.g., a dynamic random access memory chip structure), or another suitable chip structure. The chip structures 130A and 130B are also referred to as electronic devices, in accordance with some embodiments.

Each of the chip structures 130A and 130B has a substrate 132, a device layer 134, and an interconnect layer 136, in accordance with some embodiments. In some embodiments, the substrate 132 is made of an elementary semiconductor material including silicon or germanium in a single crystal structure, a polycrystal structure, or an amorphous structure.

In some other embodiments, the substrate 132 is made of a compound semiconductor, such as silicon carbide, gallium arsenide, gallium phosphide, indium phosphide, indium arsenide, an alloy semiconductor, such as SiGe or GaAsP, or a combination thereof. The substrate 132 may also include multi-layer semiconductors, semiconductor on insulator (SOI) (such as silicon on insulator or germanium on insulator), or a combination thereof.

In some embodiments, the substrate 132 is a device wafer that includes various device elements. In some embodiments, the various device elements are formed in and/or over the substrate 132. The device elements are not shown in figures for the purpose of simplicity and clarity. Examples of the various device elements include active devices, passive devices, other suitable elements, or a combination thereof. The active devices may include transistors or diodes (not shown) formed at a surface of the substrate 132. The passive devices include resistors, capacitors, or other suitable passive devices.

For example, the transistors may be metal oxide semiconductor field effect transistors (MOSFET), complementary metal oxide semiconductor (CMOS) transistors, bipolar junction transistors (BJT), high-voltage transistors, high-frequency transistors, p-channel and/or n-channel field effect transistors (PFETs/NFETs), etc. Various processes, such as front-end-of-line (FEOL) semiconductor fabrication processes, are performed to form the various device elements. The FEOL semiconductor fabrication processes may include deposition, etching, implantation, photolithography, annealing, planarization, one or more other applicable processes, or a combination thereof.

In some embodiments, isolation features (not shown) are formed in the substrate 132. The isolation features are used to define active regions and electrically isolate various device elements formed in and/or over the substrate 132 in the active regions. In some embodiments, the isolation features include shallow trench isolation (STI) features, local oxidation of silicon (LOCOS) features, other suitable isolation features, or a combination thereof.

The substrate 132 has a bottom surface 132a facing the interposer substrate 120, in accordance with some embodiments. The device layer 134 is over the bottom surface 132a, in accordance with some embodiments. The device layer 134 includes electronic elements (not shown), a dielectric layer 134a, and conductive pads 134b, in accordance with some embodiments.

In some embodiments, the electronic elements are formed on or in the substrate 132. The electronic elements include active elements (e.g. transistors, diodes, or the like) and/or passive elements (e.g. resistors, capacitors, inductors, or the like), in accordance with some embodiments. The dielectric layer 134a is formed over the bottom surface 132a and covers the electronic elements, in accordance with some embodiments.

The conductive pads 134b are embedded in the dielectric layer 134a and are electrically connected to the electronic elements, in accordance with some embodiments. The conductive pads 134b are made of a conductive material, such as metal (e.g., copper, aluminum, nickel, or combinations thereof), in accordance with some embodiments.

The interconnect layer 136 is formed over the device layer 134, in accordance with some embodiments. The interconnect layer 136 includes an interconnect structure (not shown) and a dielectric layer (not shown), in accordance with some embodiments. The interconnect structure is in the dielectric layer and electrically connected to the conductive pads 134b, in accordance with some embodiments.

The electronic device 130C includes active elements and/or passive elements, in accordance with some embodiments. The active elements include transistors or diodes, in accordance with some embodiments. The passive elements include resistors, capacitors, inductors, or other suitable passive elements. In some embodiments, the electronic device 130C is a chip package, which includes one or more chips, such as system-on-chips (SoC), high bandwidth memory (HBM) chips, dynamic random access memory (DRAM) chips and/or other suitable chips.

The conductive bumps 140 are connected between the conductive pads 125a and the interconnect layer 136 to electrically connect the conductive pads 125a to the conductive pads 134b through the interconnect structure of the interconnect layer 136, in accordance with some embodiments. The conductive bumps 140 are made of a solder material, such as Sn and Ag or another suitable conductive material (e.g., gold), in accordance with some embodiments. The conductive bumps 140 are solder balls, in accordance with some embodiments.

As shown in FIG. 1B, an underfill layer 150 is formed between the chip structures 130A and 130B and the interposer substrate 120 and between the electronic device 130C and the interposer substrate 120, in accordance with some embodiments. The underfill layer 150 surrounds the conductive bumps 140 and the conductive pads 125a, in accordance with some embodiments. The underfill layer 150 is made of an insulating material, such as a polymer material or a molding compound material consisting of epoxy and filler materials, in accordance with some embodiments.

As shown in FIG. 1B, a molding layer 160 is formed over the interposer substrate 120, in accordance with some embodiments. The molding layer 160 surrounds the chip structures 130A and 130B, the electronic device 130C, and the underfill layer 150, in accordance with some embodiments. The molding layer 160 fills gaps G1 and G2 between the chip structures 130A and 130B and the electronic device 130C, in accordance with some embodiments. The molding layer 160 is made of a polymer material or another suitable insulating material.

The formation of the molding layer 160 includes forming a molding material layer (not shown) over the chip structures 130A and 130B, the electronic device 130C, the underfill layer 150, and the interposer substrate 120; and removing the molding material layer over the chip structures 130A and 130B and the electronic device 130C, in accordance with some embodiments.

The removal process includes a planarization process, such as a chemical mechanical polishing process, in accordance with some embodiments. Therefore, top surfaces 131A, 131B, 131C, and 162 of the chip structures 130A and 130B, the electronic device 130C, and the molding layer 160 are substantially level with (or coplanar with) each other, in accordance with some embodiments.

Figure 1C:
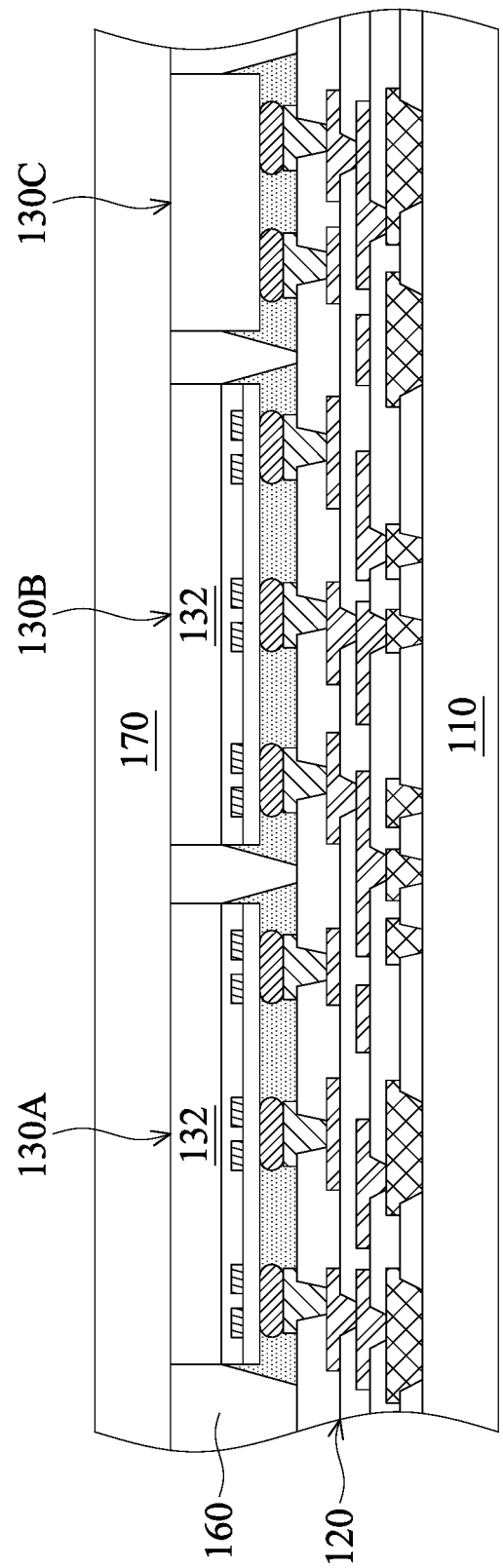

As shown in FIG. 1C, a carrier substrate 170 is bonded to the chip structures 130A and 130B, the electronic device 130C, and the molding layer 160, in accordance with some embodiments. The carrier substrate 170 is configured to provide temporary mechanical and structural support during subsequent processing steps, in accordance with some embodiments. The carrier substrate 170 includes glass, silicon, silicon oxide, aluminum oxide, metal, a combination thereof, and/or the like, in accordance with some embodiments.

Figure 1D:
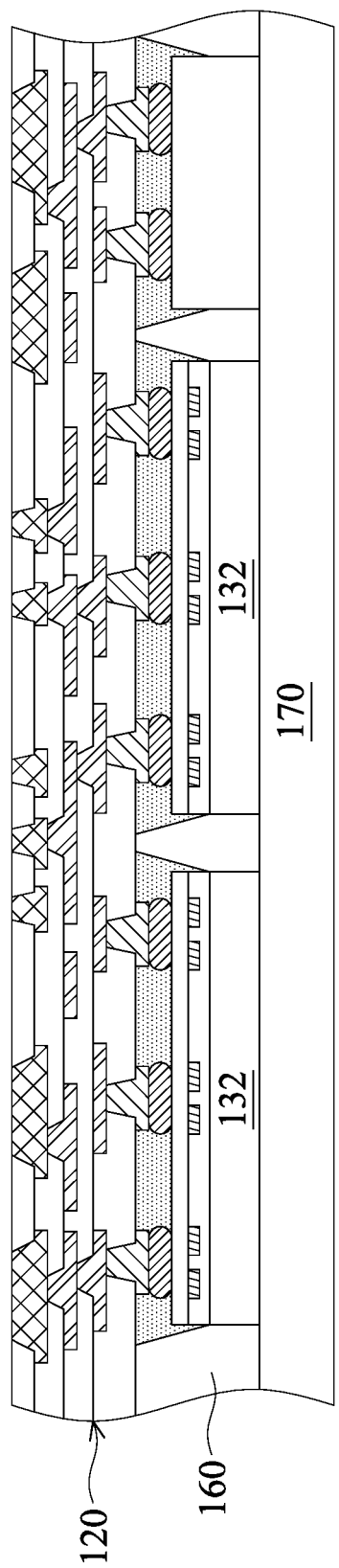

As shown in FIG. 1D, the interposer substrate 120 is flipped upside down, in accordance with some embodiments. Thereafter, as shown in FIG. 1D, the carrier substrate 110 is removed, in accordance with some embodiments.

Figure 1E:
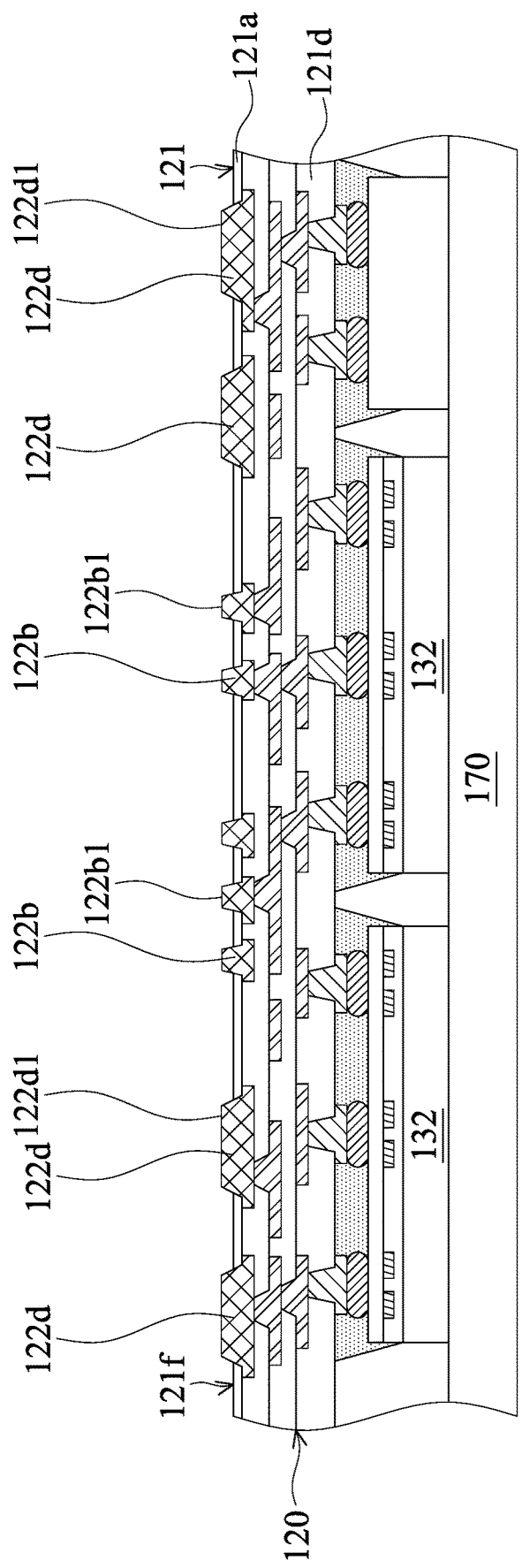

As shown in FIG. 1E, an upper portion of the insulating layer 121a is removed from the surface 121f of the insulating structure 121, in accordance with some embodiments. After the removal of the upper portion of the insulating layer 121a, end portions 122b1 and 122d1 of the conductive via structures 122b and 122d protrude from the surface 121f of the insulating structure 121, in accordance with some embodiments.

After the removal of the upper portion of the insulating layer 121a, the insulating layer 121a is thinner than the insulating layer 121d, in accordance with some embodiments. The removal process includes an etching process, such as a dry etching process or a wet etching process, in accordance with some embodiments.

Figure 1F:
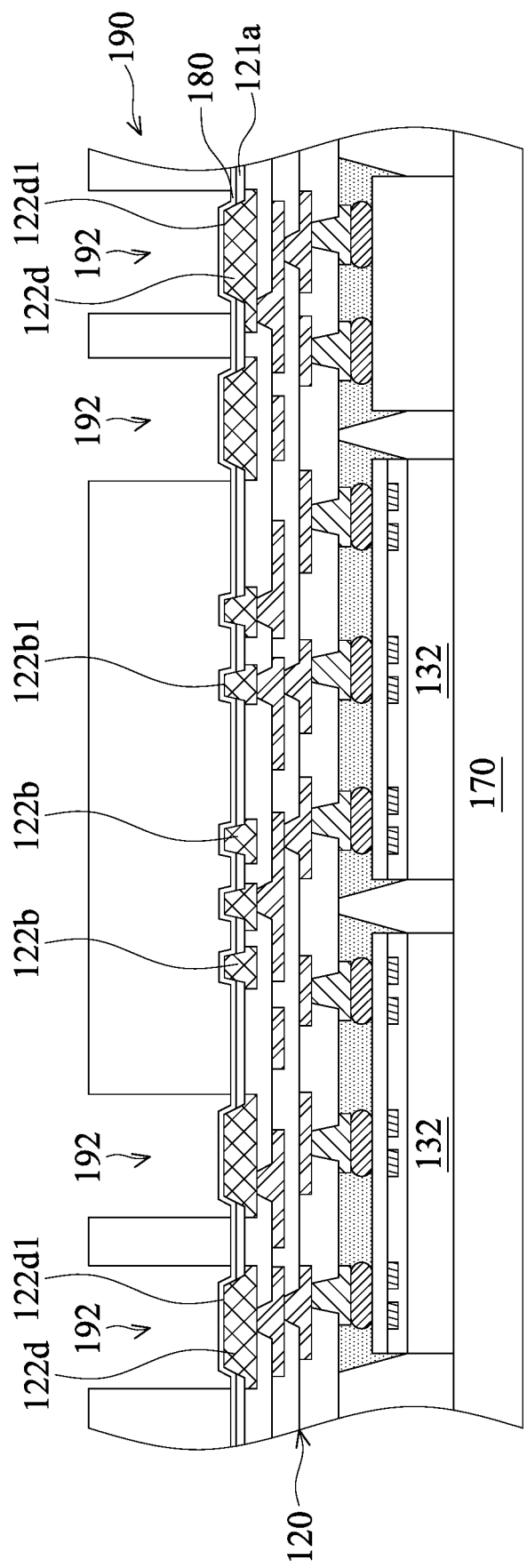

As shown in FIG. 1F, a seed layer 180 is formed over the insulating layer 121a and the end portions 122b1 and 122d1 of the conductive via structures 122b and 122d, in accordance with some embodiments. The seed layer 180 conformally covers the insulating layer 121a and the end portions 122b1 and 122d1 of the conductive via structures 122b and 122d, in accordance with some embodiments.

The seed layer 180 is made of a conductive material, such as metal (e.g., copper, aluminum, gold, silver, or tungsten) or alloys thereof, in accordance with some embodiments. The seed layer 180 is formed using a deposition process, such as a physical vapor deposition process or a chemical vapor deposition process, in accordance with some embodiments.

As shown in FIG. 1F, a mask layer 190 is formed over the seed layer 180, in accordance with some embodiments. The mask layer 190 has openings 192, in accordance with some embodiments. The openings 192 expose the seed layer 180 over the conductive via structures 122d, in accordance with some embodiments. The mask layer 190 is made of a material different from that of the seed layer 180, such as a polymer material (e.g., a photoresist material), in accordance with some embodiments.

Figure 1G:
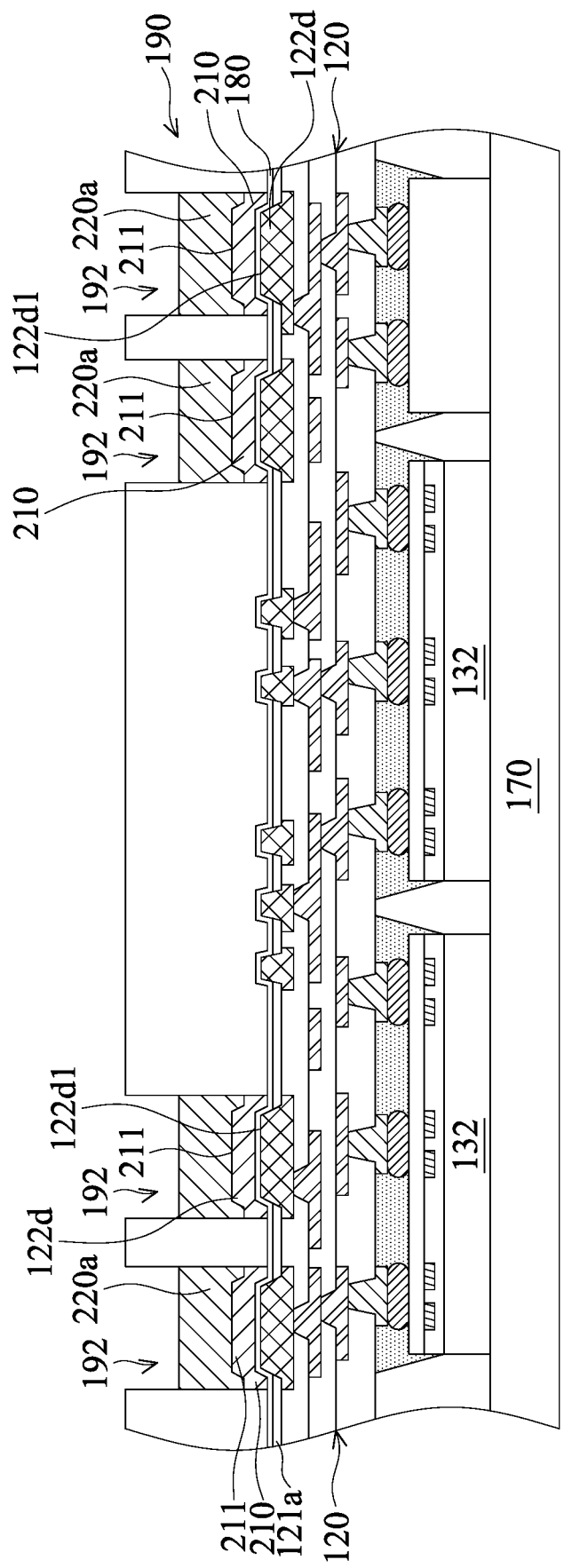

As shown in FIG. 1G, a conductive layer 210 is formed in the openings 192 of the mask layer 190, in accordance with some embodiments. The conductive layer 210 is over the seed layer 180 over the conductive via structures 122d, in accordance with some embodiments. The conductive layer 210 conformally covers the seed layer 180 over the conductive via structures 122d, in accordance with some embodiments. Therefore, the conductive layer 210 has protruding portions 211 over the conductive via structures 122d, in accordance with some embodiments. The conductive layer 210 in one of the openings 192 has an inverted U-shape, in accordance with some embodiments.

The conductive layer 210 is made of a conductive material, such as metal (e.g., copper, aluminum, gold, silver, or tungsten) or alloys thereof, in accordance with some embodiments. The conductive layer 210 is formed using a plating process, such as an electroplating process, in accordance with some embodiments.

Afterwards, as shown in FIG. 1G, a solder layer 220a is formed in the openings 192 of the mask layer 190, in accordance with some embodiments. The solder layer 220a is over the conductive layer 210, in accordance with some embodiments. The solder layer 220a is made of a conductive material, such as metal (e.g., tin, silver or the like) or alloys thereof, in accordance with some embodiments. The solder layer 220a is formed using a plating process, such as an electroplating process, in accordance with some embodiments.

Figure 1H:
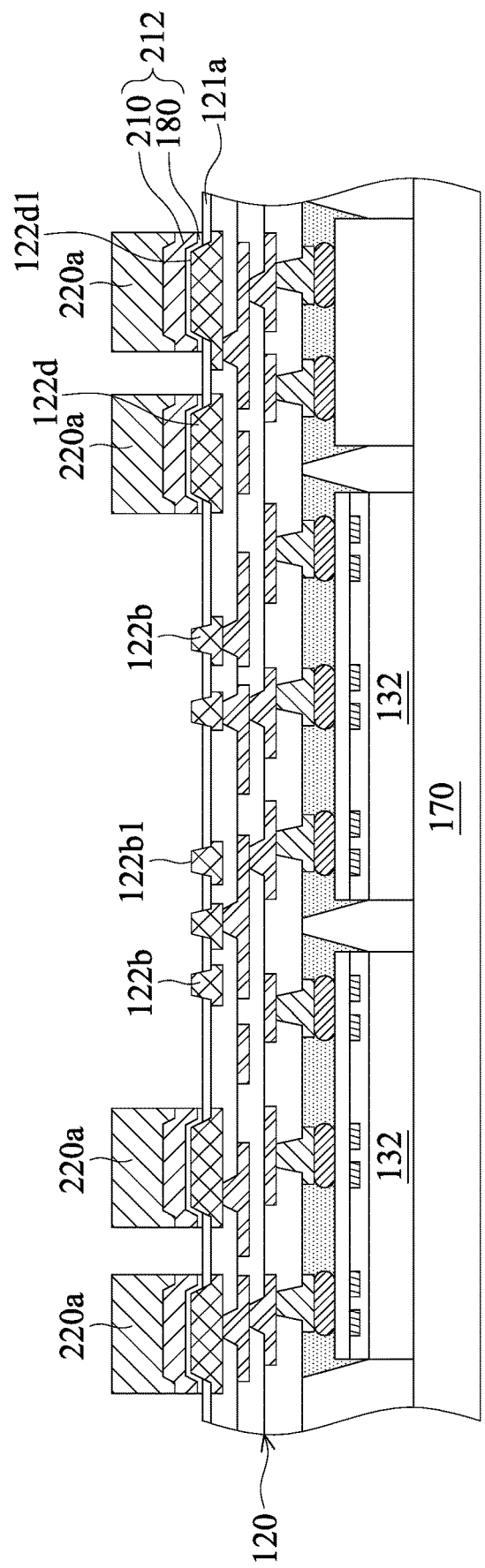

Thereafter, as shown in FIGS. 1G and 1H, the mask layer 190 is removed, in accordance with some embodiments. Afterwards, as shown in FIGS. 1G and 1H, the seed layer 180, which is not covered by the conductive layer 210, is removed, in accordance with some embodiments.

As shown in FIGS. 1G and 1H, the conductive layer 210 in one of the openings 192 and the seed layer 180 remaining thereunder together form a conductive pillar 212, in accordance with some embodiments. Each conductive pillar 212 is over the end portion 122d1 of the corresponding conductive via structure 122d, in accordance with some embodiments. The removal process includes an etching process, such as a dry etching process or a wet etching process, in accordance with some embodiments.

Figure 1I:
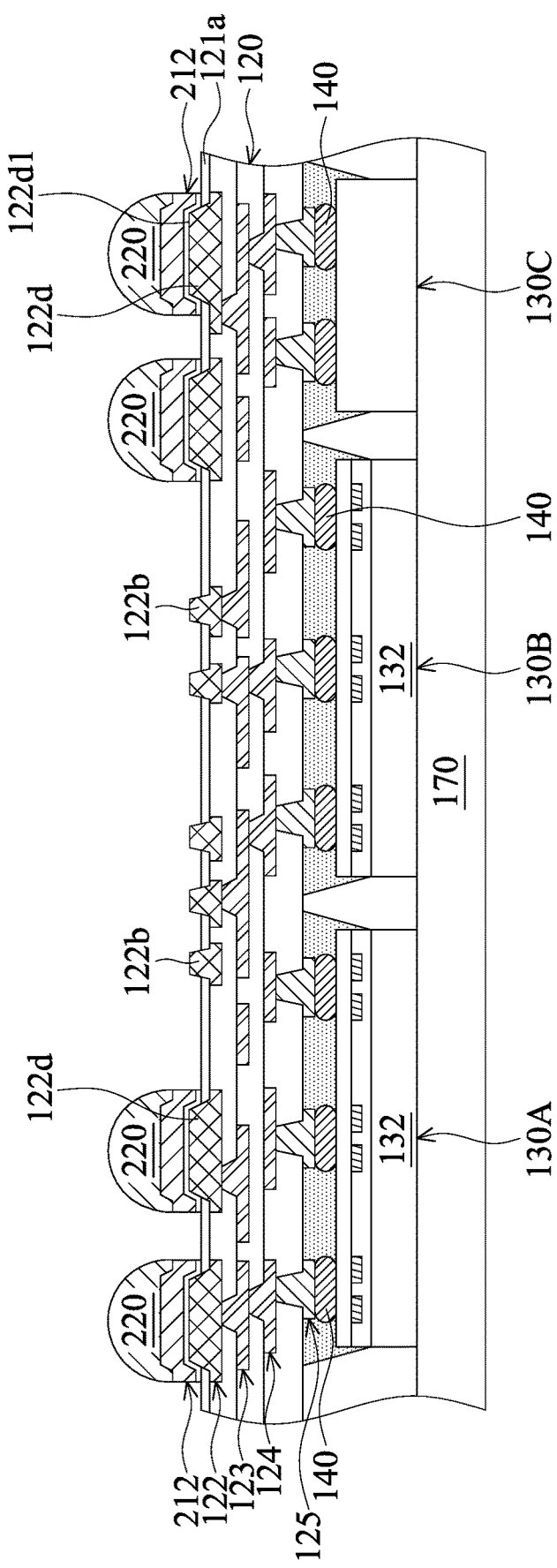

Thereafter, as shown in FIGS. 1H and 1I, an annealing process is performed over the solder layer 220a to convert the solder layer 220a into conductive bumps 220, in accordance with some embodiments. Each conductive bump 220 is over the corresponding conductive pillar 212 and the corresponding end portion 122d1 of the conductive via structure 122d, in accordance with some embodiments.

Figure 1J:
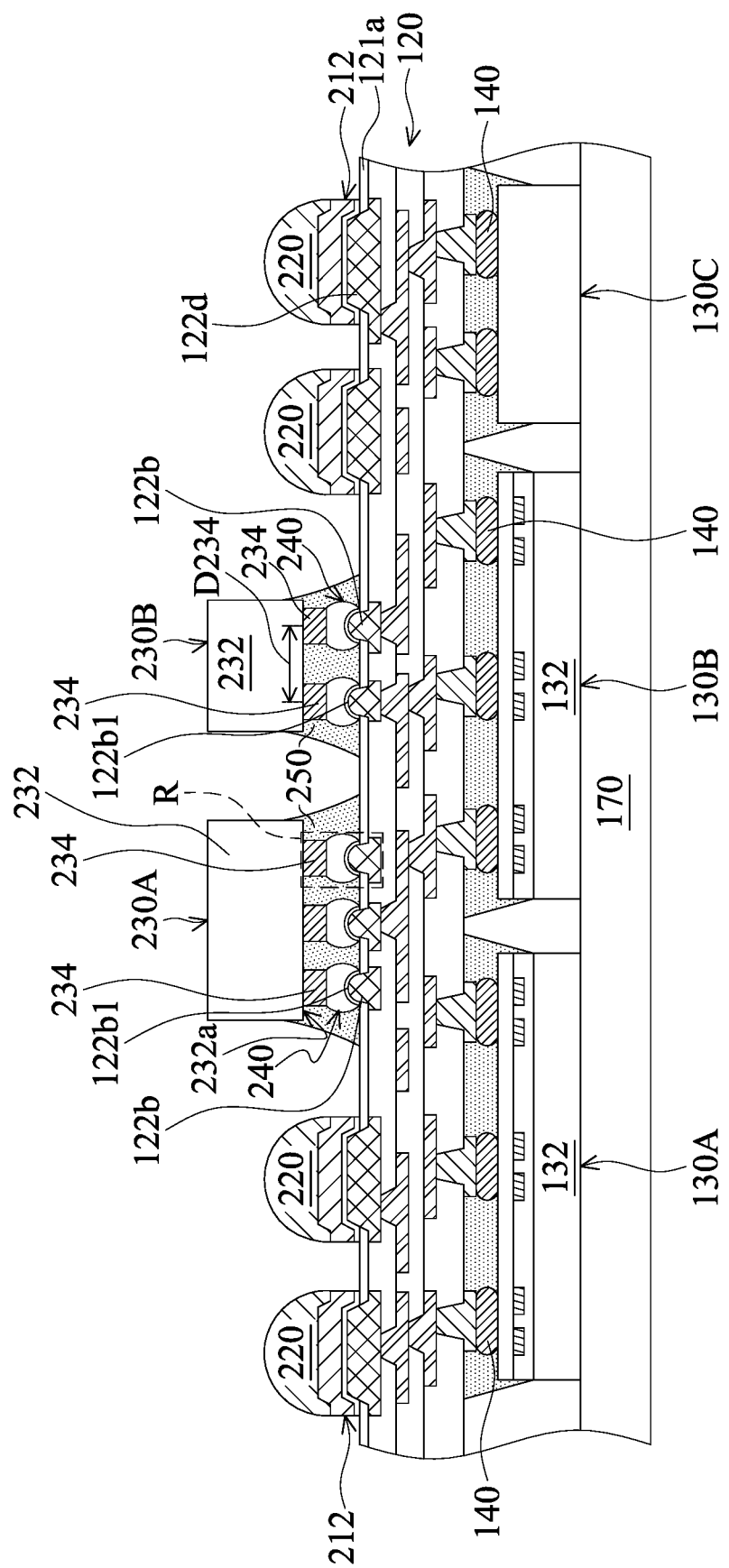
Figures 1, 1J:
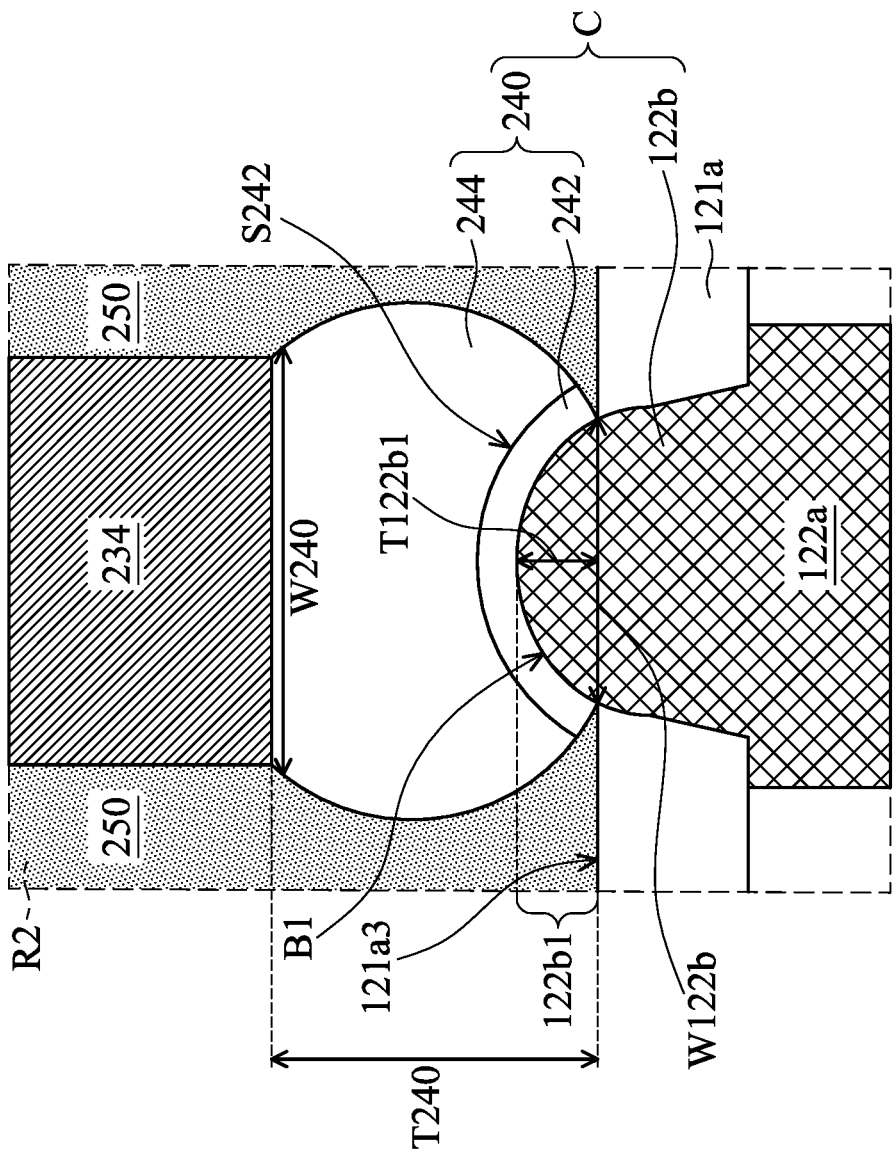

FIG. 1J-1 is an enlarged cross-sectional view of a region R of the package structure of FIG. 1J, in accordance with some embodiments. As shown in FIGS. 1J and 1J-1, electronic devices 230A and 230B are bonded to the end portions 122b1 of the conductive via structures 122b through conductive bumps 240, in accordance with some embodiments.

In some embodiments, each of the electronic devices 230A and 230B includes a main portion 232 and conductive pillars 234. The main portion 232 is similar to or substantially the same as the chip structures 130A and 130B or the electronic device 130C of FIG. 1L, in accordance with some embodiments.

The conductive pillars 234 are under and connected to a bottom surface 232a of the main portion 232, in accordance with some embodiments. The conductive pillars 234 are electrically connected to the main portion 232, in accordance with some embodiments. The conductive pillars 234 are made of a conductive material, such as metal (e.g., copper, aluminum, gold, silver, or tungsten) or alloys thereof, in accordance with some embodiments.

The conductive bumps 240 are connected between the conductive pillars 234 and the end portions 122b1 of the conductive via structures 122b, in accordance with some embodiments. The end portion 122b1 protrudes into the corresponding conductive bump 240, which increases the bonding strength between the end portion 122b1 and the corresponding conductive bump 240, in accordance with some embodiments. For example, the entire end portion 122b1 is in the corresponding conductive bump 240.

The conductive bump 240 covers the entire end portion 122b1 thereunder, in accordance with some embodiments. The end portion 122b1 is in direct contact with the corresponding conductive bump 240, in accordance with some embodiments. The conductive bump 220 is wider than the conductive bump 240, in accordance with some embodiments.

Since the embodiments do not form conductive pads (i.e., the an under-bump metallurgy (UBM) layer) over the conductive via structures 122b and therefore the conductive bumps 240 are directly boned to the end portions 122b1 of the conductive via structures 122b, which enables to form self-aligned joints, in accordance with some embodiments.

Since the end portions 122b1 of the conductive via structures 122b are smaller than the conductive pads, the conductive bumps 240 are smaller than conductive bumps (not shown) bonded to the conductive pads, in accordance with some embodiments. Therefore, the embodiments reduce the size (e.g., widths and heights) of the conductive bumps 240 by not forming the conductive pads, in accordance with some embodiments.

As a result, the distances between the centers of the conductive bumps 240 (i.e., the pitch) are reduced, which enables to form fine-pitch joints (or fine-pitch routings), which are able to achieve high I/O throughput, in accordance with some embodiments. Therefore, the design flexibility is improved, in accordance with some embodiments.

Furthermore, the distances between the conductive bumps 240 are reduced, in accordance with some embodiments. Since the embodiments do not form the conductive pads, the cost of the process and the materials for forming the conductive pads is saved, in accordance with some embodiments.

As shown in FIG. 1J-1, the width W122b of the conductive via structure 122b at the same level of the surface 121a3 of the insulating layer 121a is equal to or less than the width W240 of the conductive bump 240, in accordance with some embodiments. The width W122b ranges from about 1 μm to about 25 μm, in accordance with some embodiments. As shown in FIGS. 1J and 1J-1, a distance D234 between the centers of the conductive pillars 234 is greater than the width W240. The distance D234 ranges from about 1 μm to about 50 μm, in accordance with some embodiments.

As shown in FIG. 1J-1, a thickness T122b1 of the end portion 122b1 is less than or equal to a thickness T240 of the conductive bump 240, in accordance with some embodiments. The thickness T122b1 ranges from about 0.1 μm to about 10 μm, in accordance with some embodiments.

As shown in FIG. 1J-1, each conductive bump 240 has an alloy layer 242 and a bulk portion 244, in accordance with some embodiments. The alloy layer 242 of each conductive bump 240 is formed during bonding the bulk portions 244 to the end portions 122b1 of the conductive via structures 122b, in accordance with some embodiments.

During bonding the bulk portions 244 to the end portions 122b1 of the conductive via structures 122b, the conductive material (e.g., Sn) of the bulk portion 244 tends to bond with the conductive material (e.g., Cu) of the conductive via structure 122b thereunder, which forms the alloy layer 242 (e.g., a copper-tin alloy layer) between the bulk portion 244 and the conductive via structure 122b, in accordance with some embodiments. The alloy layer 242 includes the materials of the bulk portion 244 thereover and the conductive via structure 122b thereunder, in accordance with some embodiments.

Since the formation of the alloy layer 242 consumes an upper part (including an edge part) of the end portion 122b1 of the conductive via structure 122b thereunder, the end portion 122b1 has an end surface B1, which is a curved convex top surface, after the formation of the alloy layer 242, in accordance with some embodiments.

Furthermore, the alloy layer 242 has a curved convex top surface S242, in accordance with some embodiments. The formation of the alloy layer 242 consumes the edge part of the end portion 122b1, which prevents the stress from concentrating at the edge part of the end portion 122b1, in accordance with some embodiments. Therefore, the reliability and the yield of the conductive bumps 240 are improved, in accordance with some embodiments.

As shown in FIG. 1J-1, the width W122b of the conductive via structures 122b is less than the width W240 of the conductive bump 240, in accordance with some embodiments. As shown in FIGS. 1J and 1J-1, an underfill layer 250 is formed between the electronic devices 230A and 230B and the interposer substrate 120, in accordance with some embodiments.

The underfill layer 250 surrounds the conductive bumps 240, in accordance with some embodiments. The underfill layer 250 is made of an insulating material, such as a polymer material or a molding compound material consisting of epoxy and filler materials, in accordance with some embodiments.

As shown in FIG. 1J-1, the conductive bump 240 and the conductive via structure 122b thereunder together form a connect structure C, in accordance with some embodiments. The connect structure C has a sandglass shape, in accordance with some embodiments.

Figure 1K:
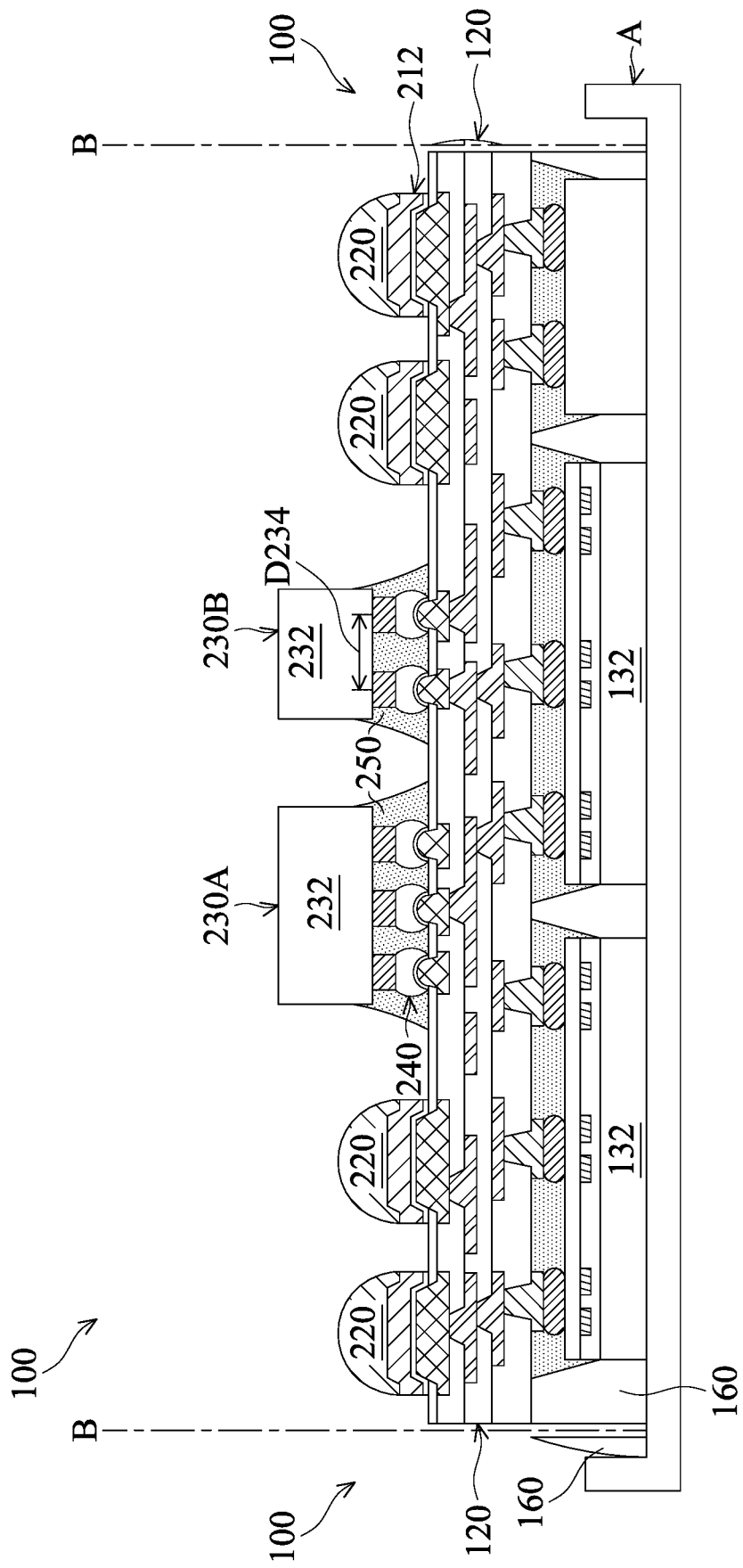

As shown in FIG. 1K, the carrier substrate 170 is removed, in accordance with some embodiments. As shown in FIG. 1K, the interposer substrate 120 is disposed over a frame A (or a carrier), in accordance with some embodiments. As shown in FIG. 1K, the interposer substrate 120 and the molding layer 160 are cut through along the predetermined cutting lines B to form chip packages 100, in accordance with some embodiments.

Figure 1L:
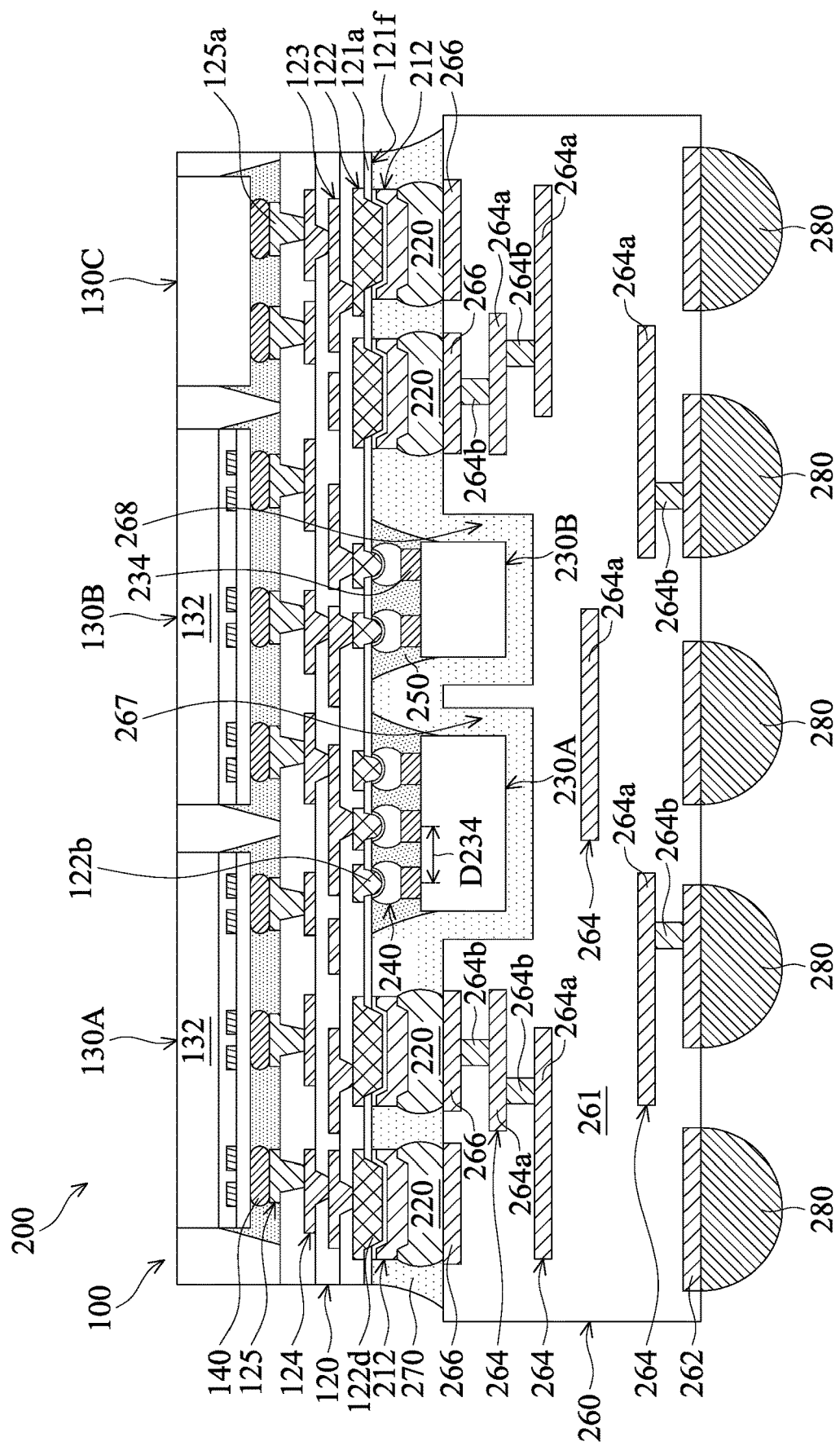

For the sake of simplicity, FIG. 1L only shows one of the chip packages 100. As shown in FIG. 1L, the chip package 100 is bonded to a wiring substrate 260 through the conductive bumps 220, in accordance with some embodiments. The electronic devices 230A and 230B are between the interposer substrate 120 and the wiring substrate 260, in accordance with some embodiments.

In some embodiments, portions of the electronic devices 230A and 230B are in the wiring substrate 260. The wiring substrate 260 has recesses 267 and 268, in accordance with some embodiments. The portions of the electronic devices 230A and 230B are respectively in the recesses 267 and 268, in accordance with some embodiments.

The wiring substrate 260 includes a dielectric layer 261, conductive pads 262, wiring layers 264, and conductive pads 266, in accordance with some embodiments. The wiring layers 264 and the conductive pads 262 and 266 are in the dielectric layer 261, in accordance with some embodiments.

The conductive bumps 220 are bonded to the conductive pads 266, in accordance with some embodiments. Each wiring layer 264 includes conductive lines 264a and conductive vias 264b, in accordance with some embodiments. The conductive vias 264b are connected between the conductive lines 264a of different wiring layers 264 and between the conductive lines 264a and the conductive pads 262 and 266, in accordance with some embodiments.

The wiring layers 264 and the conductive pads 262 and 266 are electrically connected to each other, in accordance with some embodiments. The dielectric layer 261 is made of a polymer material or another suitable material. The dielectric layer 261 includes, for example, a fiber material such as a glass fiber material, a prepreg material such as a polymer material, ABF (Ajinomoto Build-up Film), a solder resist material, or a combination thereof. The wiring layers 264 and the conductive pads 262 and 266 are made of a conductive material, such as copper, aluminum, or tungsten, in accordance with some embodiments.

Afterwards, as shown in FIG. 1L, an underfill layer 270 is formed between the chip package 100 and the wiring substrate 260, in accordance with some embodiments. The underfill layer 270 surrounds the conductive bumps 220, the conductive pillars 212, the electronic devices 230A and 230B, and the underfill layer 250, in accordance with some embodiments.

The underfill layer 270 is in the recesses 267 and 268 to separate the electronic devices 230A and 230B from the wiring substrate 260, in accordance with some embodiments. The underfill layer 270 is made of an insulating material, such as a polymer material or a molding compound material consisting of epoxy and filler materials, in accordance with some embodiments.

Afterwards, as shown in FIG. 1L, conductive bumps 280 are formed over the conductive pads 262, in accordance with some embodiments. In this step, a package structure 200 is substantially formed, in accordance with some embodiments. The conductive bumps 280 are made of a solder material, such as Sn and Ag or another suitable conductive material (e.g., gold), in accordance with some embodiments. The conductive bumps 280 are solder balls, in accordance with some embodiments.

Figure 2A:
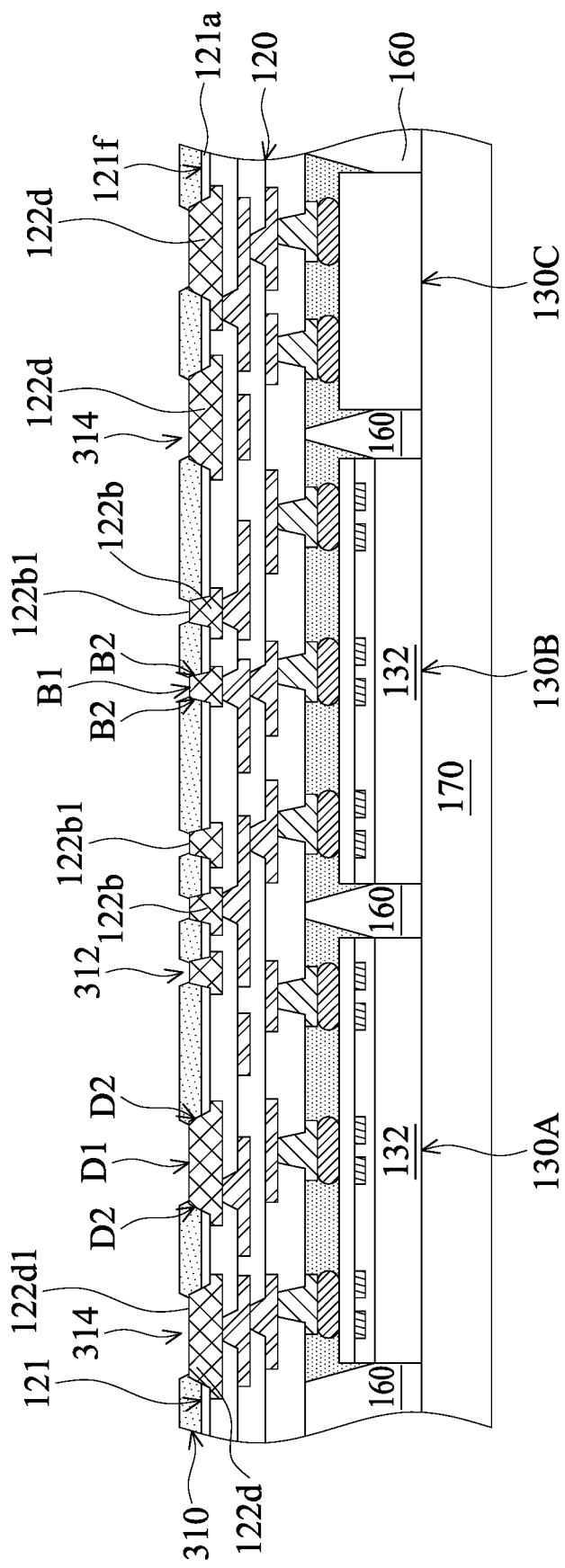
FIGS. 2A-2F are cross-sectional views of various stages of a process for forming a package structure, in accordance with some embodiments.

FIGS. 2A-2F are cross-sectional views of various stages of a process for forming a package structure, in accordance with some embodiments. After the step of FIG. 1E, as shown in FIG. 2A, an insulating layer 310 is formed over the surface 121f of the insulating structure 121, in accordance with some embodiments. The insulating layer 310 has openings 312 and 314, in accordance with some embodiments.

The openings 312 respectively expose the end portions 122b1 of the conductive via structures 122b, in accordance with some embodiments. The openings 314 respectively expose the end portions 122d1 of the conductive via structures 122d, in accordance with some embodiments. The insulating layer 310 is in direct contact with the end surface B1 and sidewalls B2 of the end portion 122b1 of each conductive via structure 122b, in accordance with some embodiments. The insulating layer 310 is in direct contact with an end surface D1 and sidewalls D2 of the end portion 122d1 of each conductive via structure 122d, in accordance with some embodiments.

The insulating layer 310 is in direct contact with the surface 121f of the insulating structure 121, in accordance with some embodiments. The insulating layer 310 is made of an insulating material such as a polymer material (e.g., polybenzoxazole, polyimide, or a photosensitive material), nitride (e.g., silicon nitride), oxide (e.g., silicon oxide), silicon oxynitride, or the like, in accordance with some embodiments.

Figure 2B:
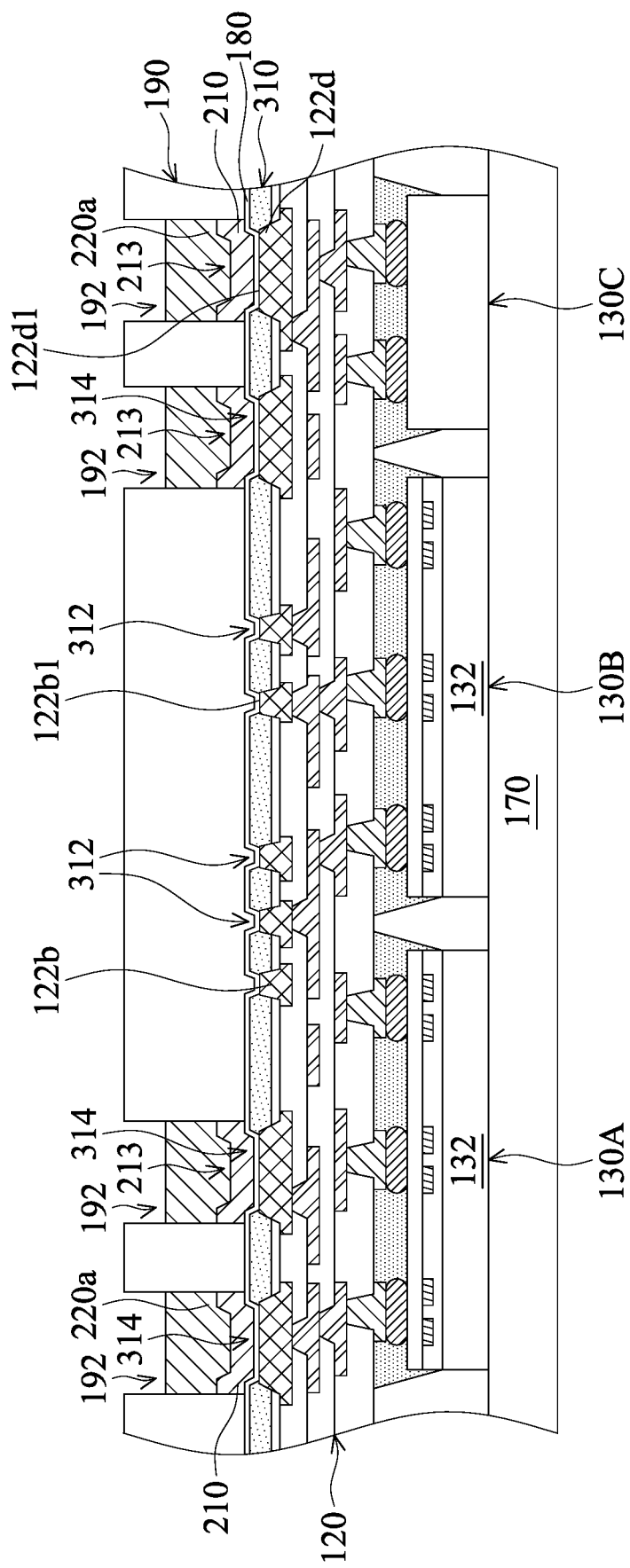

As shown in FIG. 2B, the steps of FIGS. 1F and 1G are performed to form the seed layer 180, the mask layer 190, the conductive layer 210, and the solder layer 220a, in accordance with some embodiments. The conductive layer 210 has recesses 213 over the openings 314 of the insulating layer 310 or over the conductive via structures 122d, in accordance with some embodiments. The conductive layer 210 in one of the openings 192 of the mask layer 190 has a U-like shape, in accordance with some embodiments.

Figure 2C:
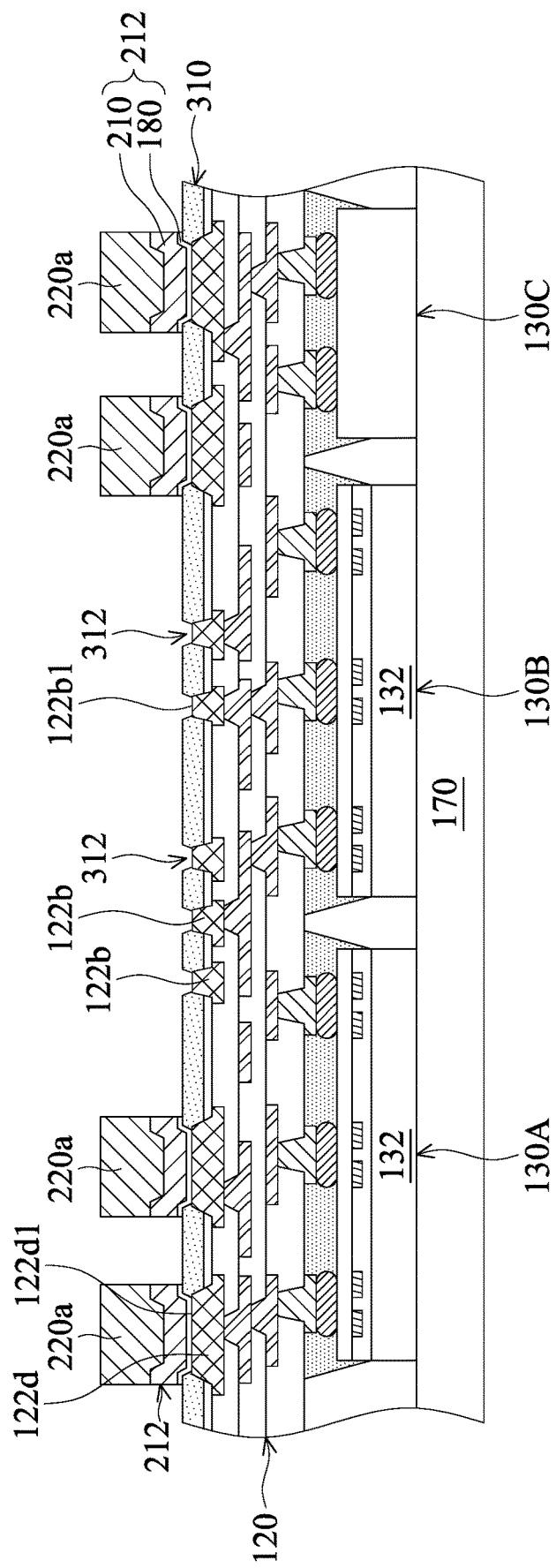

As shown in FIG. 2C, the step of FIG. 1H is performed to remove the mask layer 190 and the seed layer 180, which is not covered by the conductive layer 210, in accordance with some embodiments. As shown in FIGS. 2B and 2C, the conductive layer 210 in one of the openings 192 and the seed layer 180 remaining thereunder together form a conductive pillar 212, in accordance with some embodiments. Each conductive pillar 212 is over the end portion 122d1 of the corresponding conductive via structure 122d, in accordance with some embodiments.

Figure 2D:
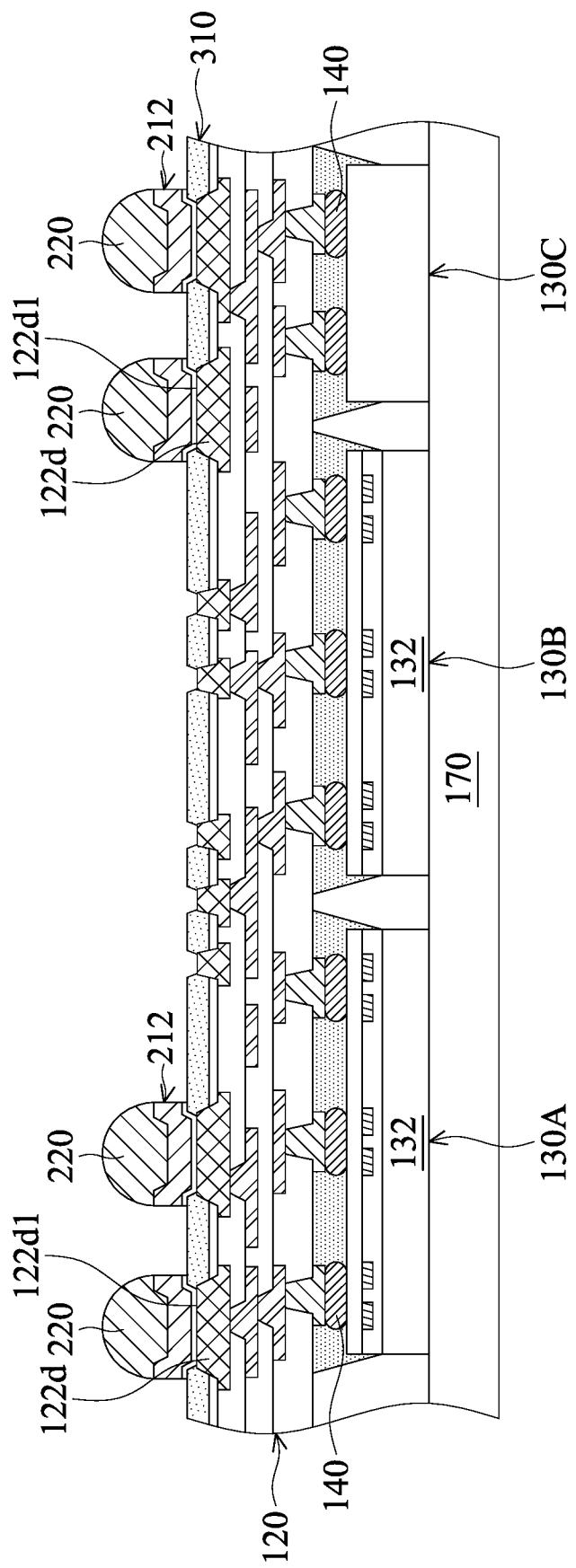

As shown in FIG. 2D, an annealing process is performed over the solder layer 220a to convert the solder layer 220a into conductive bumps 220, in accordance with some embodiments. Each conductive bump 220 is over the corresponding conductive pillar 212 and the end portion 122d1 of the corresponding conductive via structure 122d, in accordance with some embodiments.

Figure 2E:
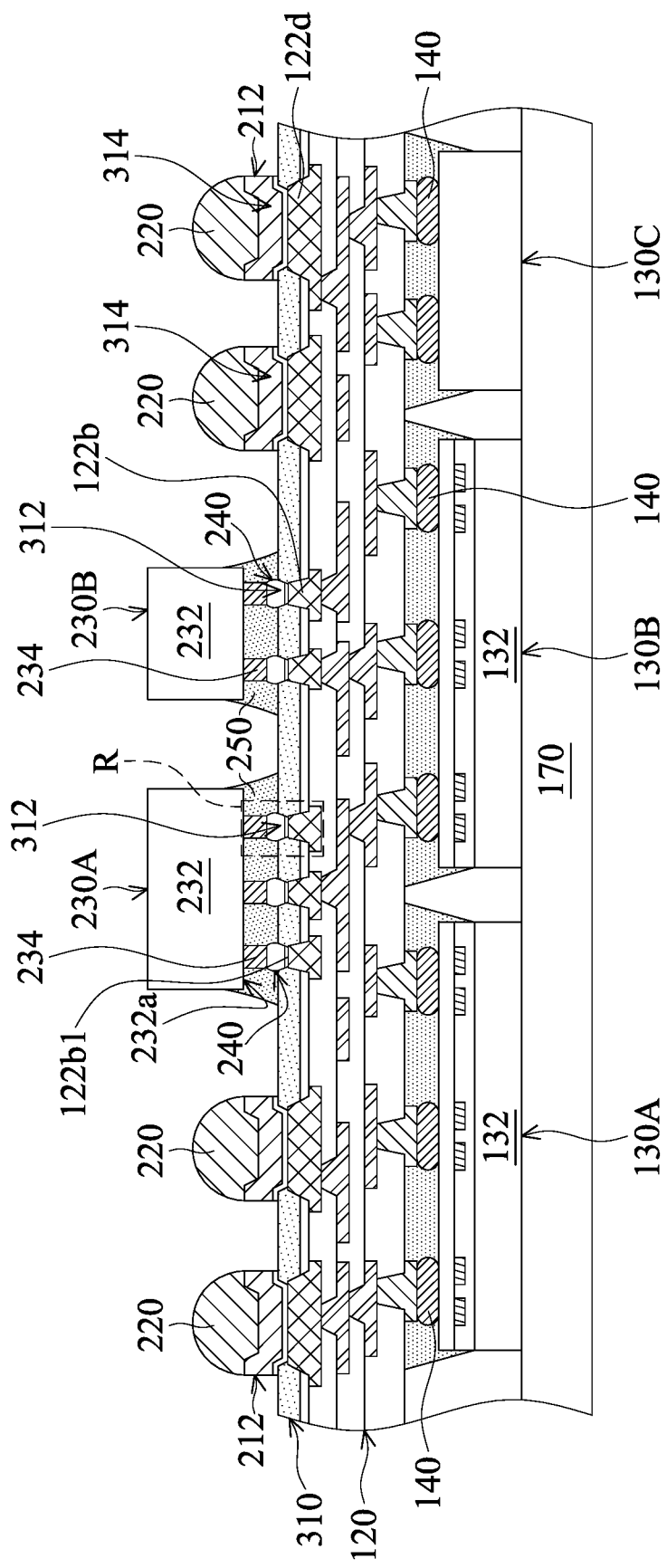
Figures 1, 2E:
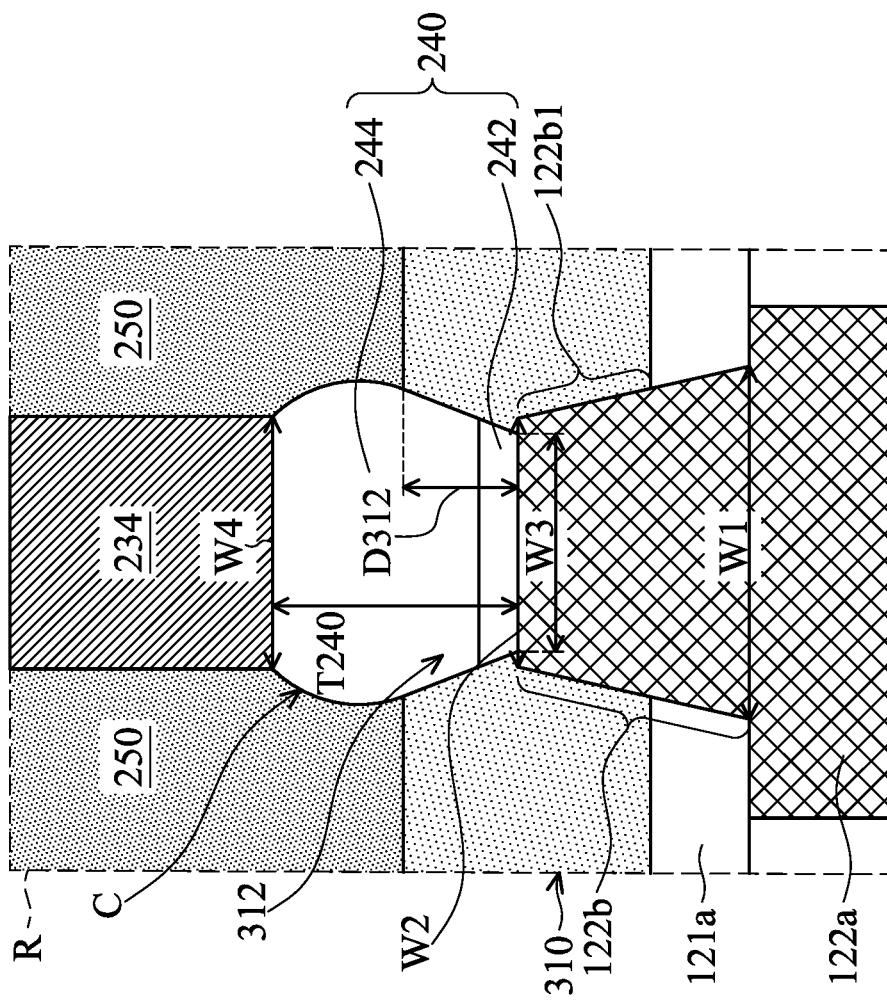

FIG. 2E-1 is an enlarged cross-sectional view of a region R of the package structure of FIG. 2E, in accordance with some embodiments. Afterwards, as shown in FIGS. 2E and 2E-1, the step of FIG. 1J is performed to form the electronic devices 230A and 230B, the conductive bumps 240, and the underfill layer 250, in accordance with some embodiments.

The electronic devices 230A and 230B are formed over the insulating layer 310, in accordance with some embodiments. The conductive bumps 240 are formed in the openings 312 of the insulating layer 310, in accordance with some embodiments. The conductive bumps 240 pass through the insulating layer 310, in accordance with some embodiments. The conductive bumps 240 are connected between the conductive pillars 234 of the electronic devices 230A and 230B and the end portions 122b1 of the conductive via structures 122b, in accordance with some embodiments.

As shown in FIG. 2E-1, the thickness T240 of the conductive bump 240 is greater than the depth D312 of the opening 312, in accordance with some embodiments. The width W3 of the conductive bump 240 adjacent to the conductive via structure 122b is less than the width W4 of the conductive bump 240 adjacent to the conductive pillar 234, in accordance with some embodiments.

The width W4 is less than or equal to the width W2 of the conductive via structure 122b adjacent to the conductive bump 240, in accordance with some embodiments. The width W2 is less than the width W1 of the conductive via structure 122b adjacent to the conductive line 122a, in accordance with some embodiments.

As shown in FIG. 2E-1, each conductive bump 240 has an alloy layer 242 and a bulk portion 244 over the alloy layer 242, in accordance with some embodiments. The alloy layer 242 of each conductive bump 240 is formed during bonding the bulk portions 244 to the end portions 122b1 of the conductive via structures 122b, in accordance with some embodiments.

During bonding the bulk portions 244 to the end portions 122b1 of the conductive via structures 122b, the conductive material (e.g., Sn) of the bulk portion 244 tends to bond with the conductive material (e.g., Cu) of the conductive via structure 122b thereunder, which forms the alloy layer 242 (e.g., a copper-tin alloy layer) between the bulk portion 244 and the conductive via structure 122b, in accordance with some embodiments. The alloy layer 242 includes the materials of the bulk portion 244 thereover and the conductive via structure 122b thereunder, in accordance with some embodiments.

As shown in FIG. 2E-1, the conductive bump 240 and the conductive via structure 122b thereunder together form a connect structure C, in accordance with some embodiments. The connect structure C has a sandglass shape, in accordance with some embodiments. The conductive bumps 240 include solder bumps, in accordance with some embodiments.

Figure 2F:
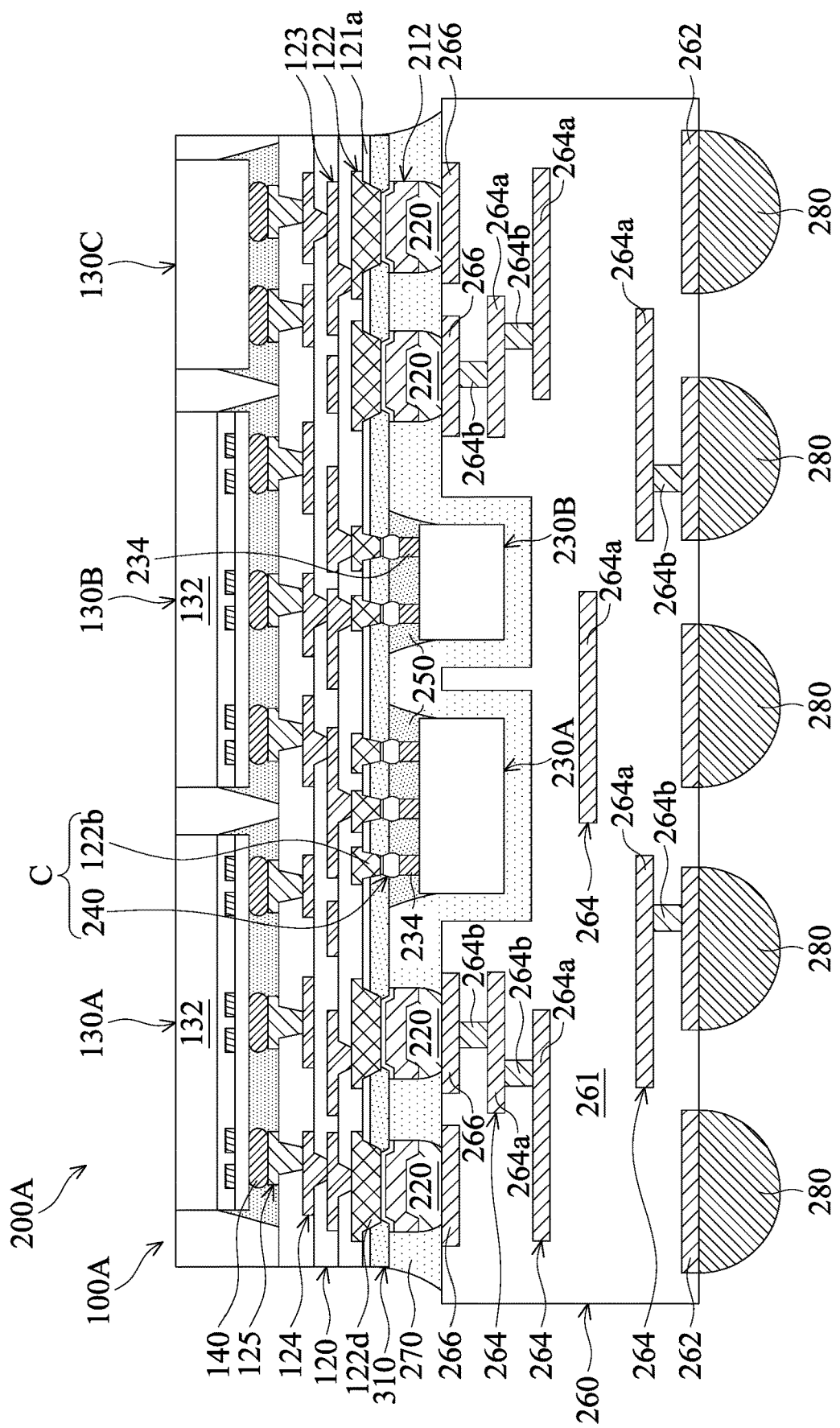

As shown in FIG. 2F, the steps of FIGS. 1K and 1L are performed to form the chip packages 100A, to bond one of the chip packages 100A to the wiring substrate 260 through the conductive bumps 220, and to form the underfill layer 270 and the conductive bumps 280, in accordance with some embodiments. In this step, a package structure 200A is substantially formed, in accordance with some embodiments.

The underfill layer 270 is formed between the chip package 100A and the wiring substrate 260, in accordance with some embodiments. The underfill layer 270 is in direct contact with the insulating layer 310, the conductive pillars 212, the conductive bumps 220, the electronic devices 230A and 230B, the underfill layer 250, and the wiring substrate 260, in accordance with some embodiments.

The insulating layer 310 is used as a stress buffer layer and a conductive bump confinement layer, which prevents the conductive bumps 240 from bridging, in accordance with some embodiments. The sizes (e.g., widths) of the conductive bumps 240 are able to be adjusted by adjusting the design of the insulating layer 310, which improves the design flexibility, in accordance with some embodiments.

Figure 3A:
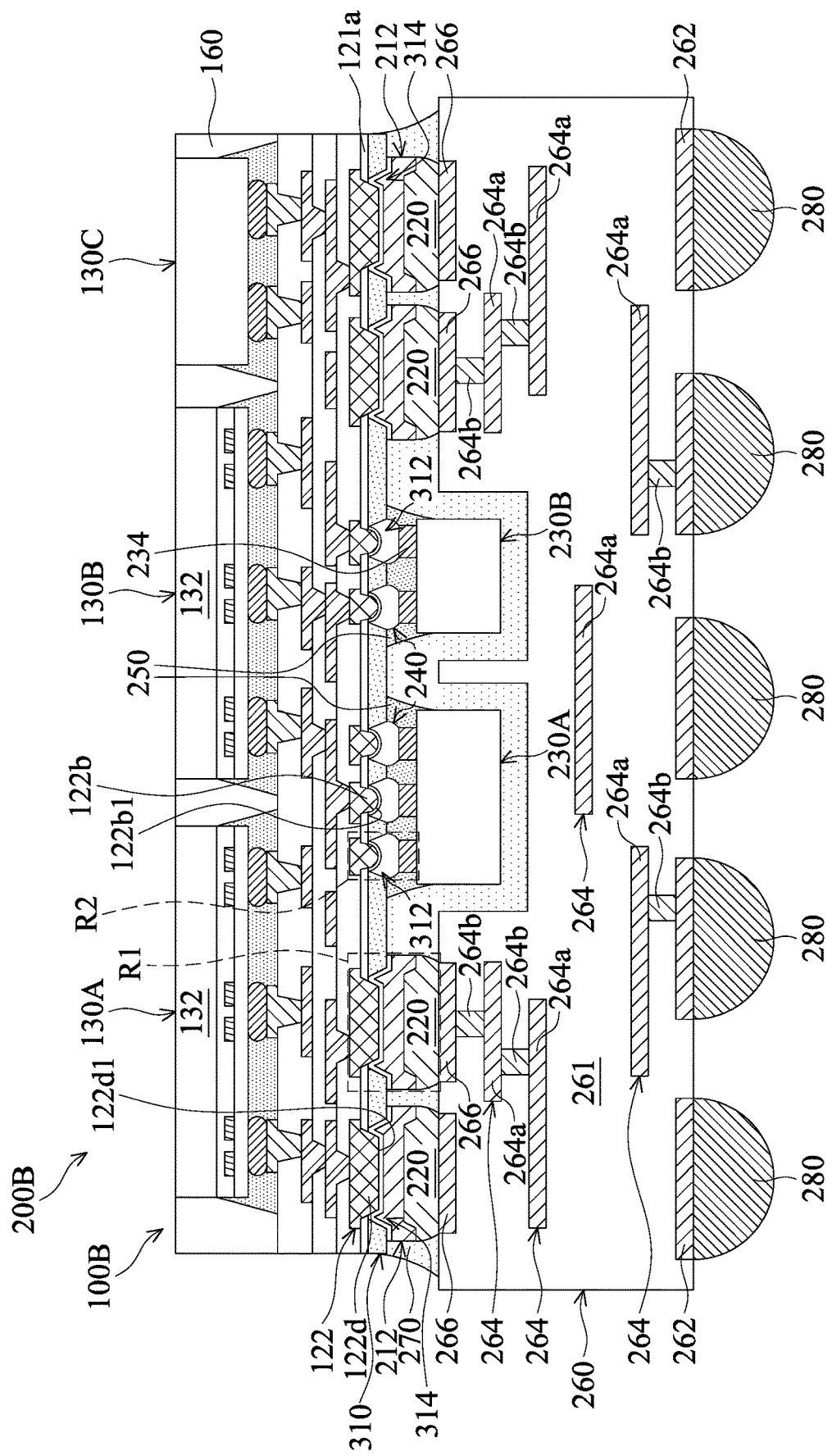
FIG. 3A is a cross-sectional view of a package structure, in accordance with some embodiments.
Figure 3B:
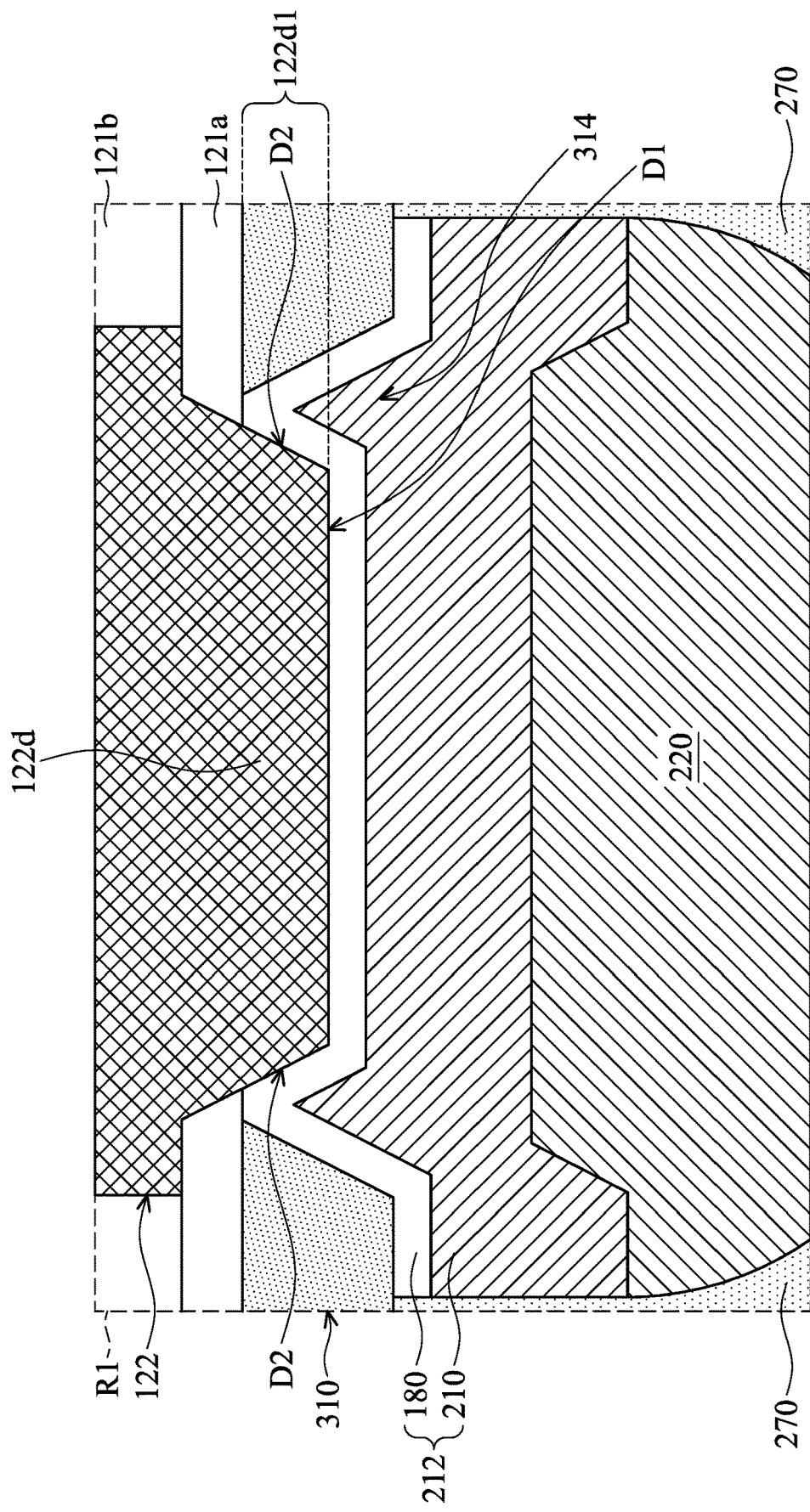
FIG. 3B is an enlarged cross-sectional view of a first region of the package structure of FIG. 3A, in accordance with some embodiments.
Figure 3C:
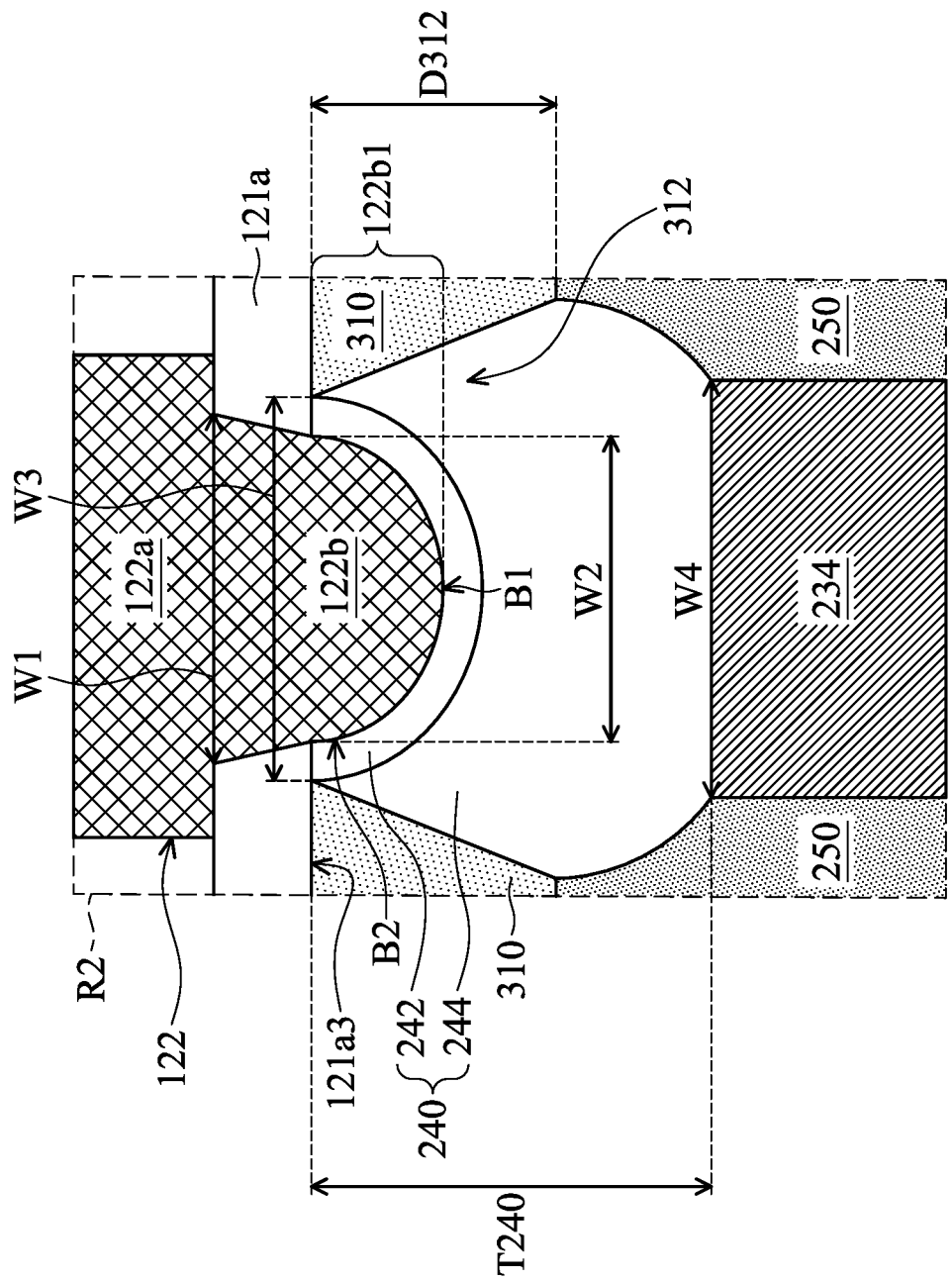
FIG. 3C is an enlarged cross-sectional view of a second region of the package structure of FIG. 3A, in accordance with some embodiments.

FIG. 3A is a cross-sectional view of a package structure 200B, in accordance with some embodiments. FIG. 3B is an enlarged cross-sectional view of a first region R1 of the package structure 200B of FIG. 3A, in accordance with some embodiments. FIG. 3C is an enlarged cross-sectional view of a second region R2 of the package structure 200B of FIG. 3A, in accordance with some embodiments.

As shown in FIGS. 3A, 3B and 3C, the package structure 200B and the chip package 100B are respectively similar to the package structure 200A and the chip package 100A of FIG. 2F, except that the openings 312 and 314 of the insulating layer 310 respectively expose the entire end portions 122b1 and 122d1 of the conductive via structures 122b and 122d, in accordance with some embodiments.

As shown in FIG. 3B, each opening 314 of the insulating layer 310 exposes the end surface D1 and the sidewalls D2 of the end portion 122d1 of the corresponding conductive via structure 122d, in accordance with some embodiments. The conductive pillar 212 covers the end surface D1 and the sidewalls D2 of the corresponding end portion 122d1, in accordance with some embodiments.

The conductive pillar 212 is in direct contact with the end surface D1 and the sidewalls D2 of the corresponding end portion 122d1, in accordance with some embodiments. The end portion 122d1 is in the corresponding conductive pillar 212, in accordance with some embodiments.

As shown in FIG. 3C, each opening 312 of the insulating layer 310 exposes the end surface B1 and the sidewalls B2 of the end portion 122b1 of the corresponding conductive via structure 122b, in accordance with some embodiments. The conductive bump 240 covers the end surface B1 and the sidewalls B2 of the corresponding end portion 122b1, in accordance with some embodiments.

The conductive bump 240 is in direct contact with the end surface B1 and the sidewalls B2 of the corresponding end portion 122b1, in accordance with some embodiments. The end portion 122b1 is in the corresponding conductive bump 240, in accordance with some embodiments.

As shown in FIG. 3C, the thickness T240 of the conductive bump 240 is greater than the depth D312 of the opening 312, in accordance with some embodiments. A ratio of the thickness T240 to the depth D312 ranges from about 1 to about 6, in accordance with some embodiments. The depth D312 ranges from about 1 µm to about m, in accordance with some embodiments. The width W2 of the conductive via structure 122b at the same level of the surface 121a3 of the insulating layer 121a is less than the width W1 of the conductive via structure 122b adjacent to the conductive line 122a, in accordance with some embodiments.

The width W1 is less than or equal to the width W3 of the conductive bump 240 adjacent to the conductive via structure 122b, in accordance with some embodiments. The width W3 is less than the width W4 of the conductive bump 240 adjacent to the conductive pillar 234, in accordance with some embodiments.

Figure 4A:
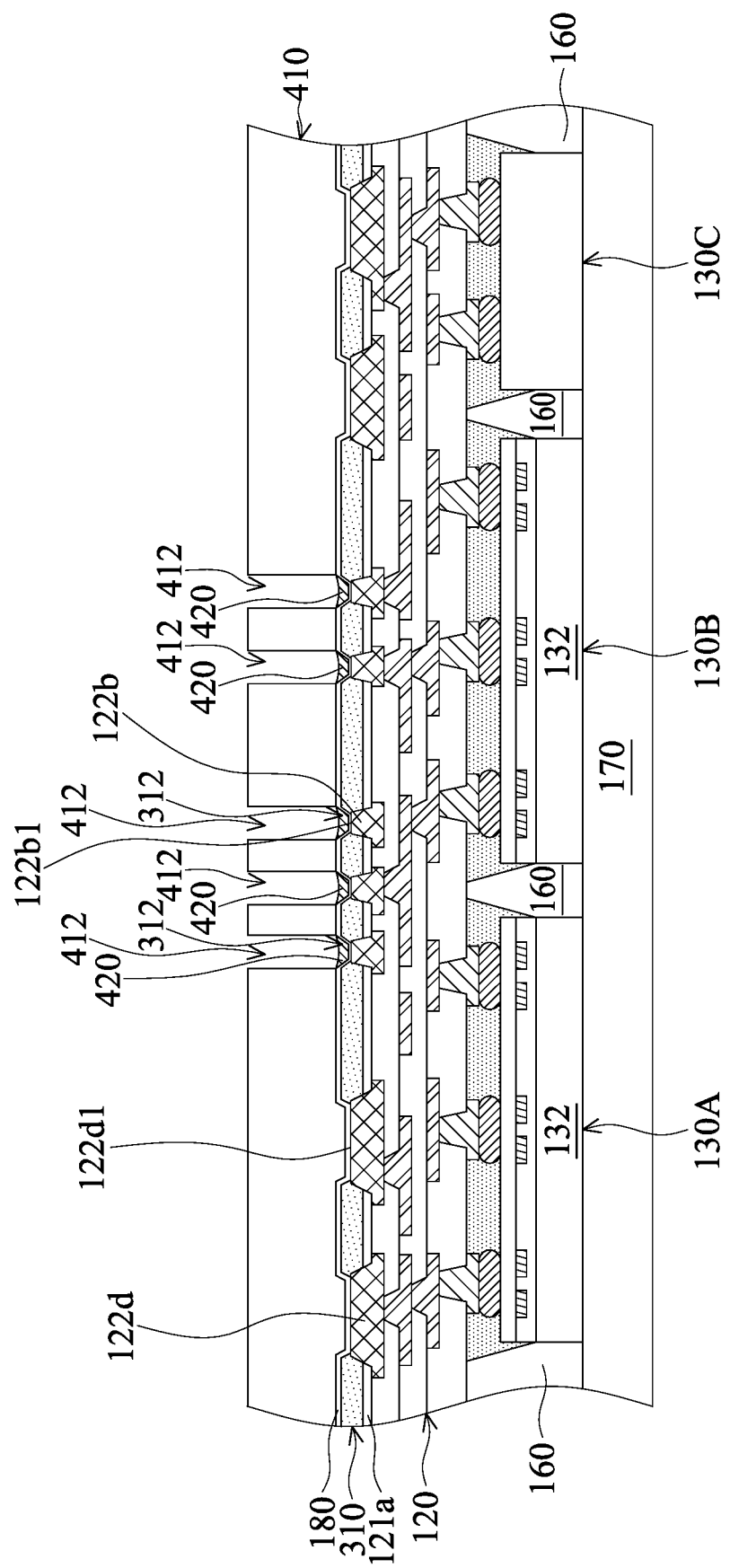
FIGS. 4A-4D are cross-sectional views of various stages of a process for forming a package structure, in accordance with some embodiments.

FIGS. 4A-4D are cross-sectional views of various stages of a process for forming a package structure, in accordance with some embodiments. After the step of FIG. 2A, as shown in FIG. 4A, a seed layer 180 is formed over the insulating layer 310 and the end portions 122b1 and 122d1 of the conductive via structures 122b and 122d, in accordance with some embodiments. The seed layer 180 conformally covers the insulating layer 310 and the end portions 122b1 and 122d1 of the conductive via structures 122b and 122d, in accordance with some embodiments.

Thereafter, as shown in FIG. 4A, a mask layer 410 is formed over the seed layer 180, in accordance with some embodiments. The mask layer 410 has openings 412, in accordance with some embodiments. The openings 412 expose the seed layer 180 over the conductive via structures 122b, in accordance with some embodiments. The exposed seed layer 180 is in the openings 312 of the insulating layer 310, in accordance with some embodiments. Afterwards, as shown in FIG. 4A, a conductive layer 420 is formed over the exposed seed layer 180, in accordance with some embodiments.

The conductive layer 420 is made of a conductive material, such as metal (e.g., copper, aluminum, gold, silver, or tungsten) or alloys thereof, in accordance with some embodiments. The conductive layer 420 is formed using a plating process, such as an electroplating process, in accordance with some embodiments.

Figure 4B:
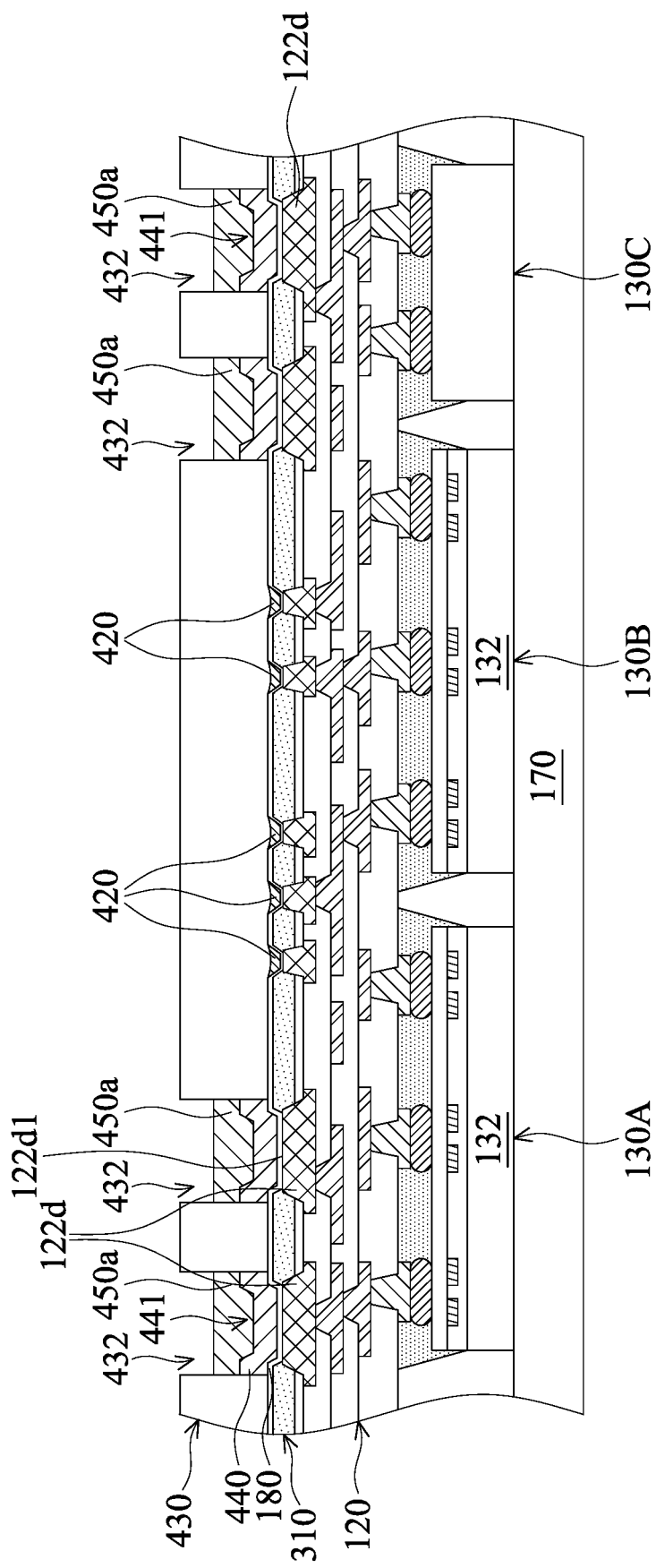

As shown in FIG. 4B, the mask layer 410 is removed, in accordance with some embodiments. As shown in FIG. 4B, a mask layer 430 is formed over the seed layer 180, in accordance with some embodiments. The mask layer 430 has openings 432, in accordance with some embodiments. The openings 432 expose the seed layer 180 over the conductive via structures 122d, in accordance with some embodiments. The mask layer 430 is made of a material different from that of the seed layer 180, such as a polymer material (e.g., a photoresist material), in accordance with some embodiments.

As shown in FIG. 4B, a conductive layer 440 is formed in the openings 432 of the mask layer 430, in accordance with some embodiments. The conductive layer 440 is over the seed layer 180 over the conductive via structures 122d, in accordance with some embodiments. The conductive layer 440 conformally covers the seed layer 180 over the conductive via structures 122d, in accordance with some embodiments. Therefore, the conductive layer 440 has recesses 441 over the end portions 122d1 of the conductive via structures 122d, in accordance with some embodiments. The conductive layer 440 in one of the openings 432 has a U-shape, in accordance with some embodiments.

The conductive layer 440 is made of a conductive material, such as metal (e.g., copper, aluminum, gold, silver, or tungsten) or alloys thereof, in accordance with some embodiments. The conductive layer 440 is formed using a plating process, such as an electroplating process, in accordance with some embodiments.

Afterwards, as shown in FIG. 4B, a solder layer 450a is formed in the openings 432 of the mask layer 430, in accordance with some embodiments. The solder layer 450a is over the conductive layer 440, in accordance with some embodiments. The solder layer 450a is made of a conductive material, such as metal (e.g., tin, silver or the like) or alloys thereof, in accordance with some embodiments. The solder layer 450a is formed using a plating process, such as an electroplating process, in accordance with some embodiments.

Figure 4C:
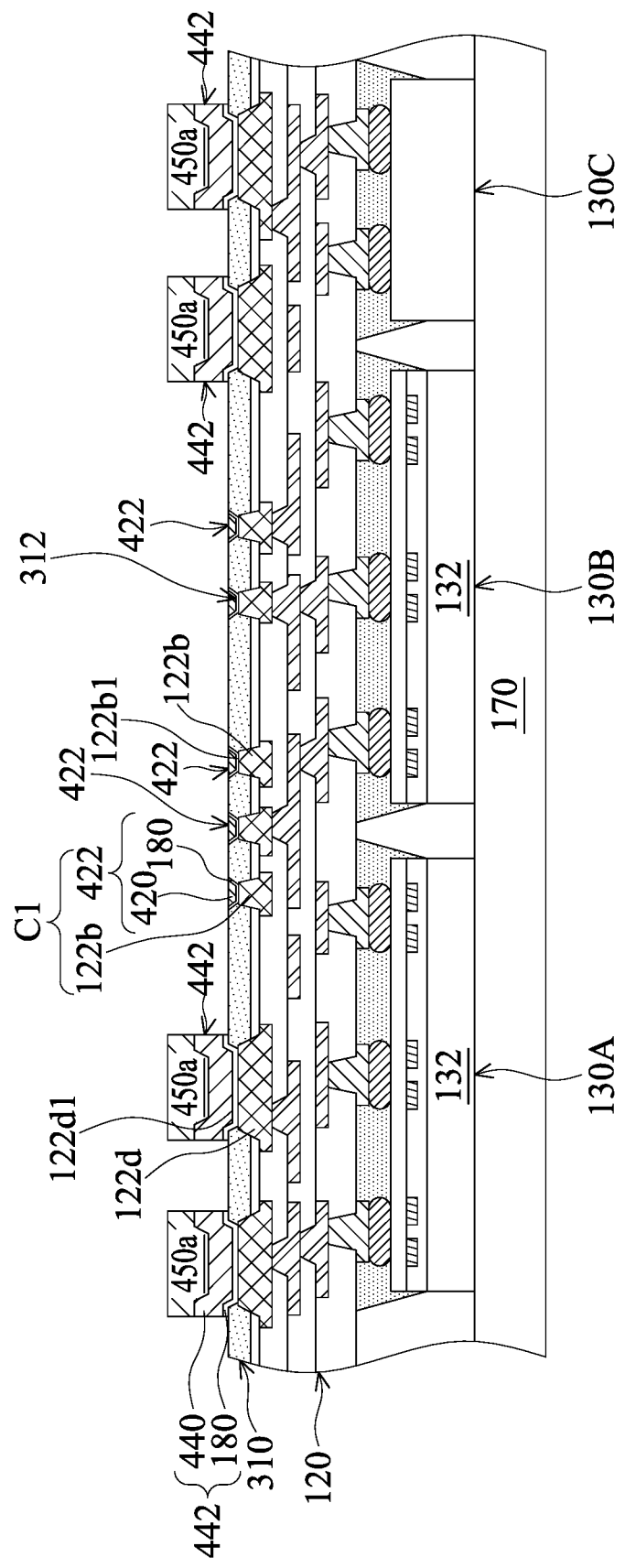

Thereafter, as shown in FIGS. 4B and 4C, the mask layer 430 is removed, in accordance with some embodiments. Afterwards, as shown in FIGS. 4B and 4C, the seed layer 180, which is not covered by the conductive layer 440, is removed, in accordance with some embodiments. As shown in FIGS. 4B and 4C, the conductive layer 440 in one of the openings 432 and the seed layer 180 remaining thereunder together form a conductive pillar 442, in accordance with some embodiments. Each conductive pillar 442 is over the end portion 122d1 of the corresponding conductive via structure 122d, in accordance with some embodiments.

During the removal of the seed layer 180, the conductive layer 420 outside of the openings 312 of the insulating layer 310 is removed, in accordance with some embodiments. After the removal process, the conductive layer 420 remaining in one of the openings 312 and the seed layer 180 remaining thereunder together form a conductive structure 422, in accordance with some embodiments. The conductive structure 422 includes a conductive pillar, in accordance with some embodiments.

The conductive structure 422 and the conductive via structure 122b thereunder together form a connect structure C1, in accordance with some embodiments. The connect structure C1 has a sandglass shape, in accordance with some embodiments. The removal process includes an etching process, such as a dry etching process or a wet etching process, in accordance with some embodiments.

Figure 4D:
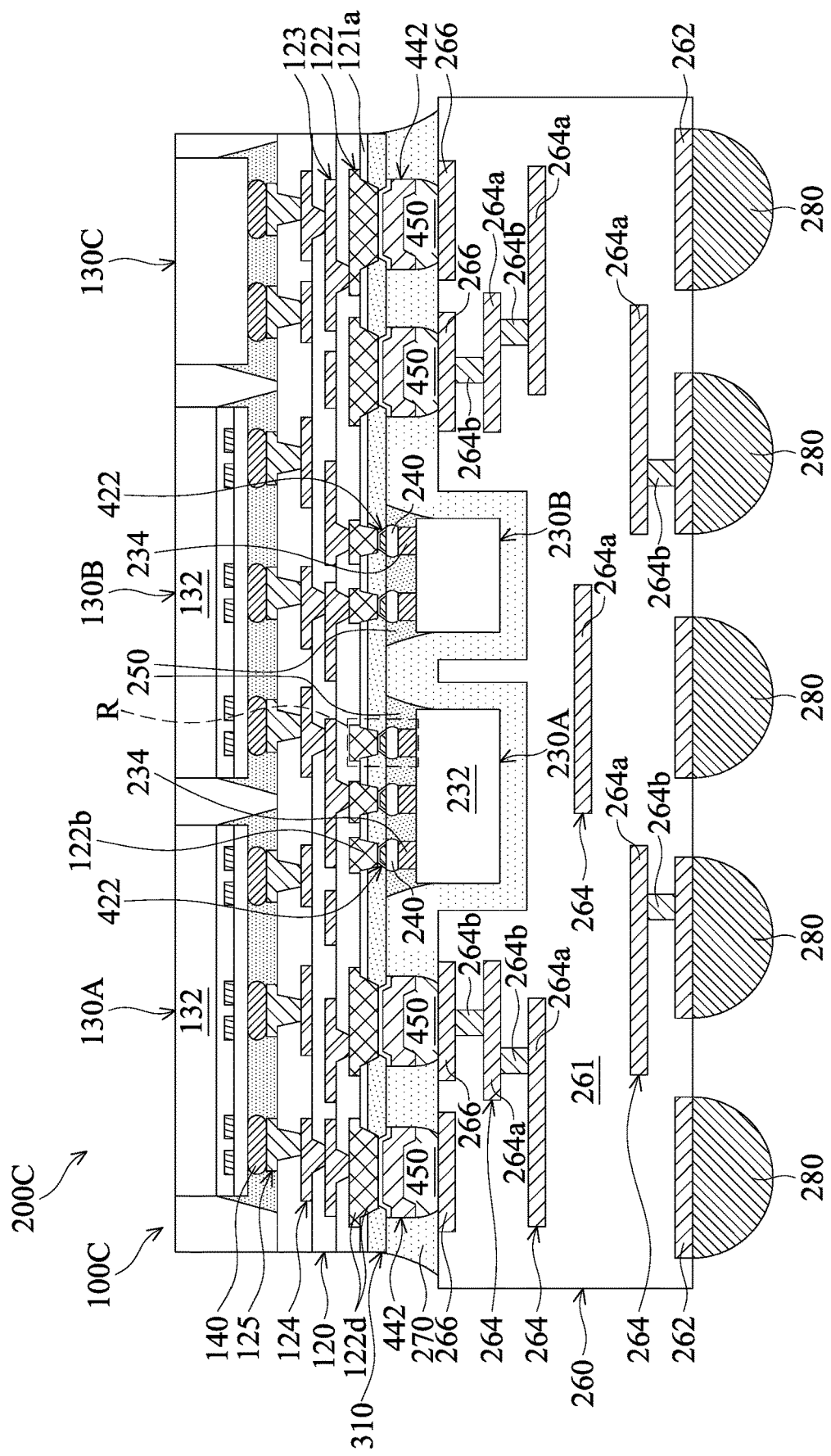
Figures 1, 4D:
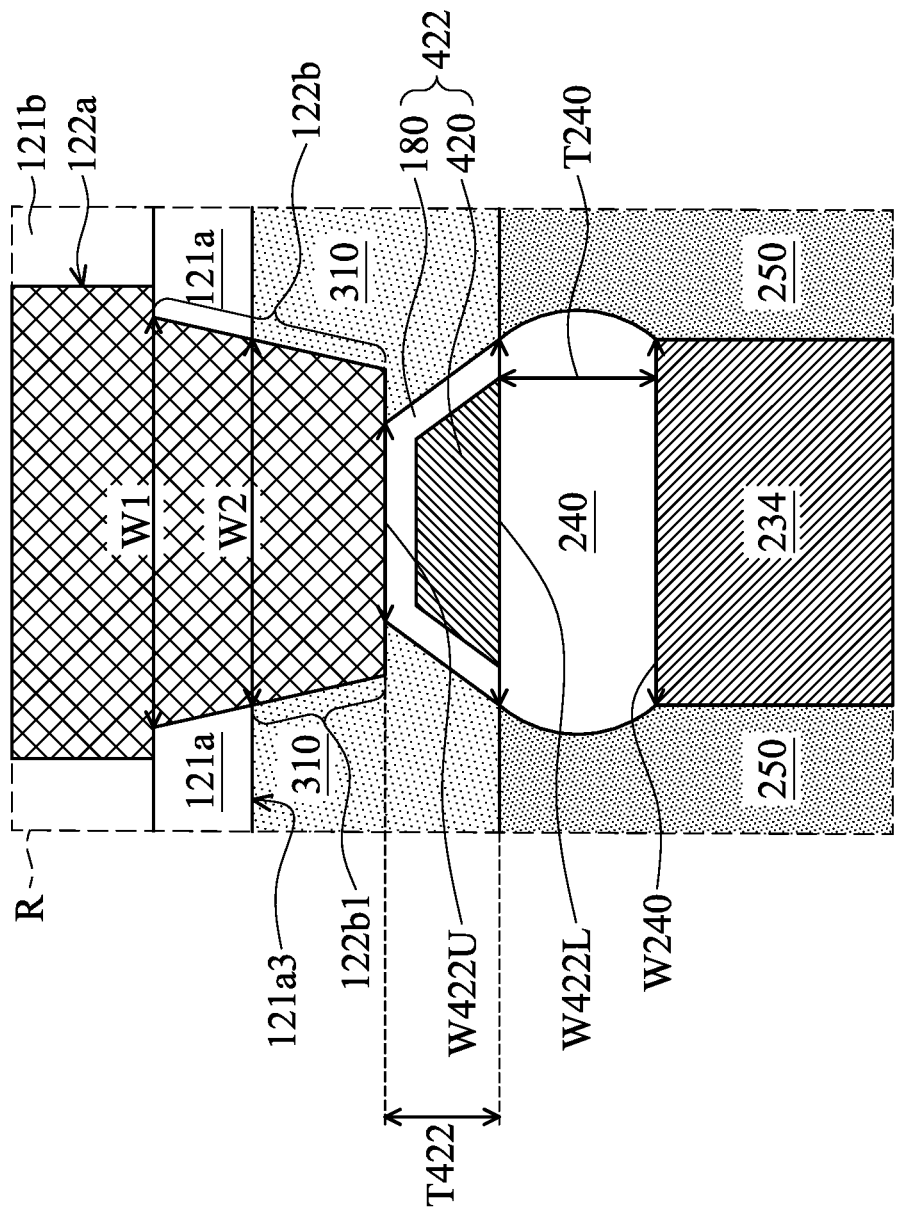

FIG. 4D-1 is an enlarged cross-sectional view of a region R of the package structure of FIG. 4D, in accordance with some embodiments. As shown in FIGS. 4D and 4D-1, the steps of FIGS. 1I-1L are performed to convert the solder layer 450a into conductive bumps 450, to form the electronic devices 230A and 230B, the conductive bumps 240, the underfill layer 250, and the chip packages 100C, to bond one of the chip packages 100C to the wiring substrate 260 through the conductive bumps 450, and to form the underfill layer 270 and the conductive bumps 280, in accordance with some embodiments. In this step, a package structure 200C is substantially formed, in accordance with some embodiments.

As shown in FIG. 4D-1, the thickness T240 of the conductive bump 240 ranges from about 1 µm to about 20 µm, in accordance with some embodiments. The thickness T422 of the conductive structure 422 ranges from about 1 µm to about 10 µm, in accordance with some embodiments. The width W422U of the conductive structure 422 adjacent to the conductive via structure 122b is less than the width W422L of the conductive structure 422 adjacent to the conductive bumps 240, in accordance with some embodiments.

The width W422L is less than or equal to the width W240 of the conductive bump 240, in accordance with some embodiments. The width W240 is less than or equal to the width W2 of the conductive via structure 122b at the same level of the surface 121a3 of the insulating layer 121a, in accordance with some embodiments. The width W2 is less than the width W1 of the conductive via structure 122b adjacent to the conductive line 122a, in accordance with some embodiments.

Figure 5A:
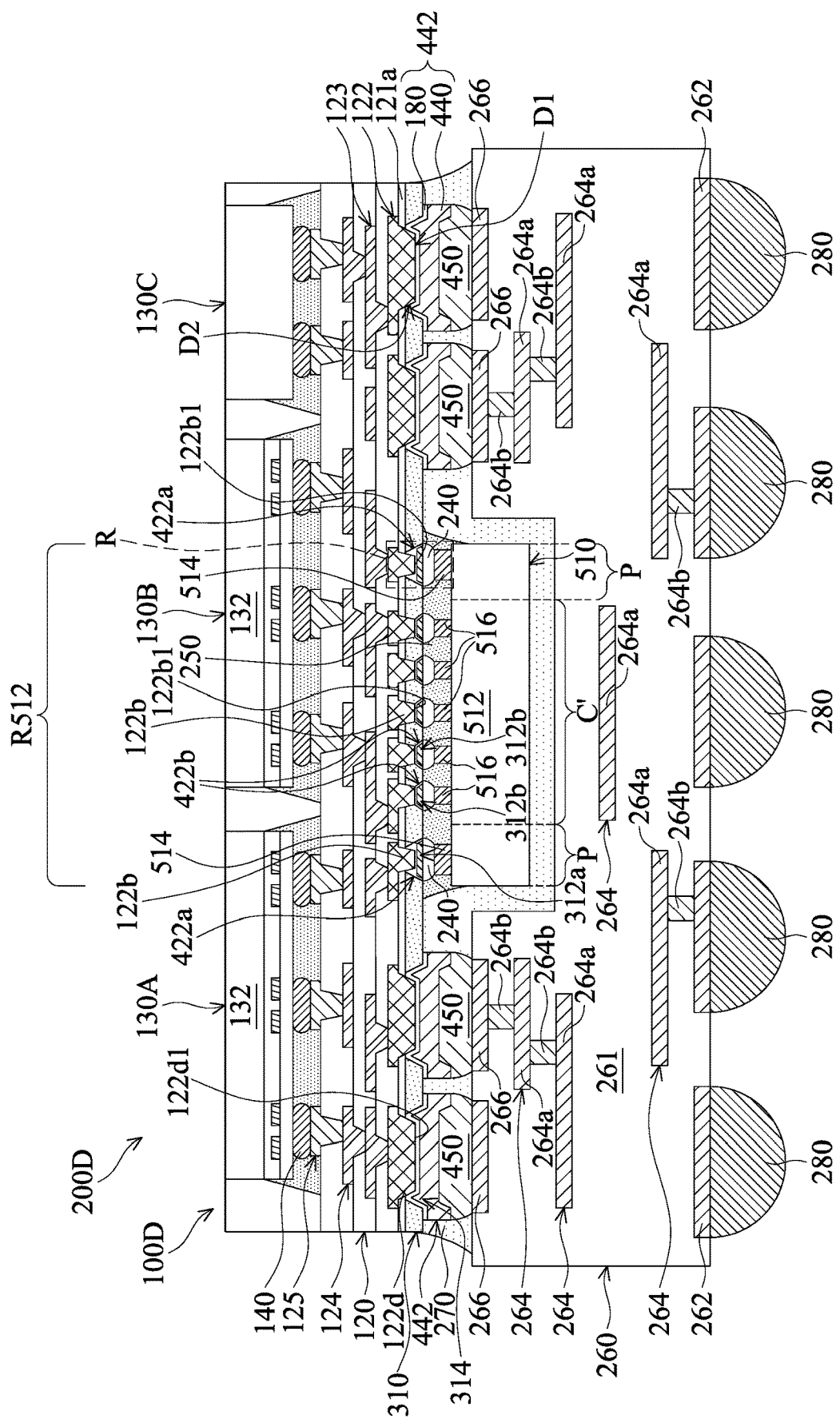
FIG. 5A is a cross-sectional view of a package structure, in accordance with some embodiments.
Figure 5B:
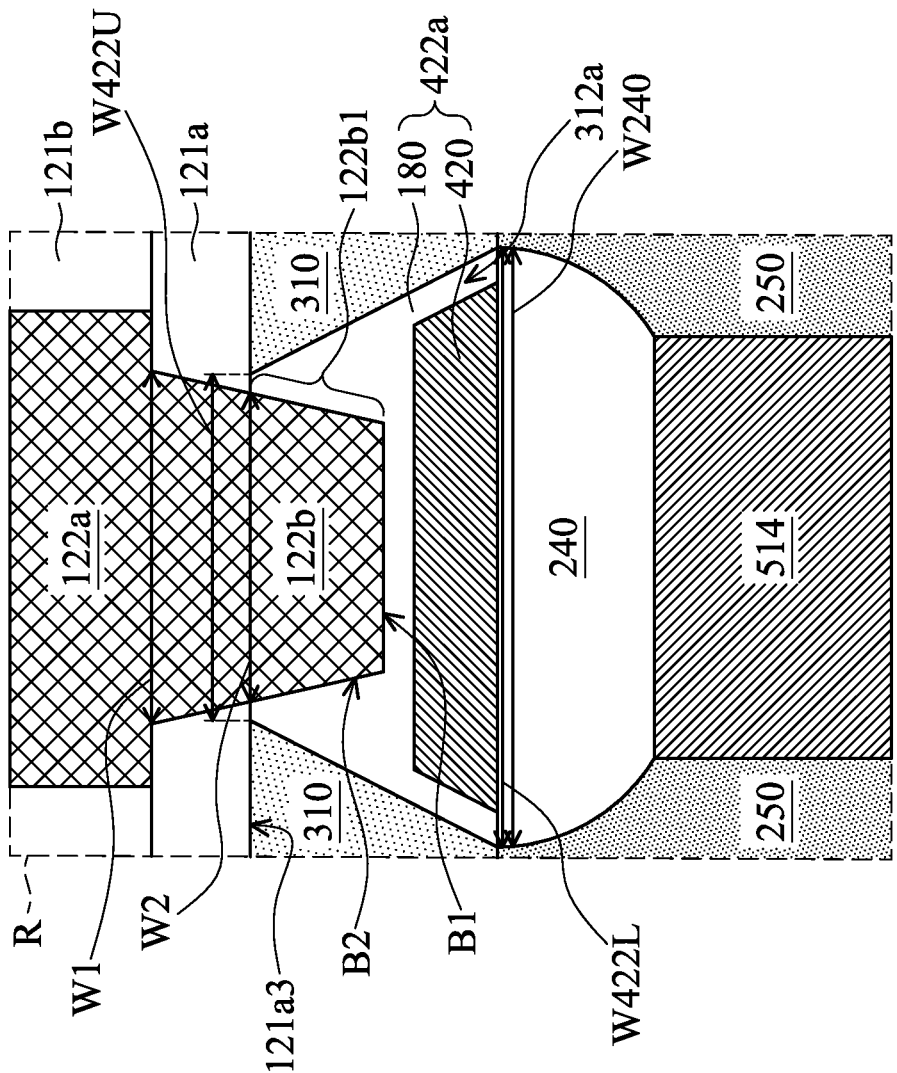
FIG. 5B is an enlarged cross-sectional view of a region of the package structure of FIG. 5A, in accordance with some embodiments.
Figure 5C:
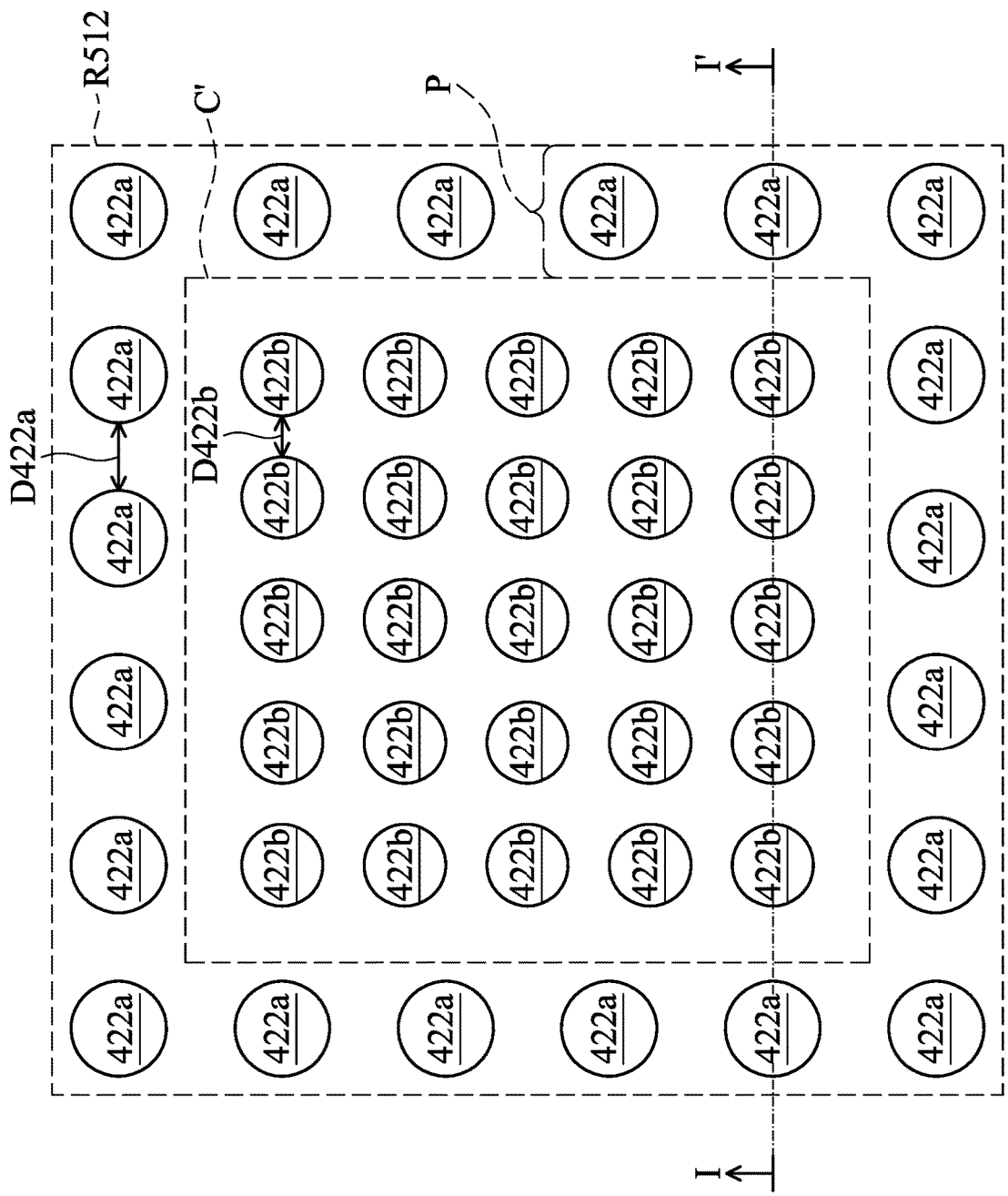
FIG. 5C is a bottom view of the conductive structures in a region of FIG. 5A, in accordance with some embodiments.

FIG. 5A is a cross-sectional view of a package structure 200D, in accordance with some embodiments. FIG. 5B is an enlarged cross-sectional view of a region R of the package structure 200D of FIG. 5A, in accordance with some embodiments. FIG. 5C is a bottom view of the conductive structures 422a and 422b in a region R512 of FIG. 5A, in accordance with some embodiments.

As shown in FIG. 5A, the package structure 200D and the chip package 100D are respectively similar to the package structure 200C and the chip package 100C of FIG. 4D, except that the openings 314 of the insulating layer 310 expose the entire end portions 122d1 of the conductive via structures 122d, and the openings 312a of the insulating layer 310 expose the entire end portions 122b1 of the conductive via structures 122b, in accordance with some embodiments.

As shown in FIG. 5A, the openings 314 of the insulating layer 310 expose the end surfaces D1 and the sidewalls D2 of the end portions 122d1 of the conductive via structures 122d, in accordance with some embodiments. Each conductive pillar 442 covers and is in direct contact with the end surface D1 and the sidewalls D2 of the corresponding end portion 122d1, in accordance with some embodiments.

As shown in FIGS. 5A and 5B, the openings 312a of the insulating layer 310 expose the end surfaces B1 and the sidewalls B2 of the end portions 122b1 of the conductive via structures 122b, in accordance with some embodiments. Each conductive structure 422a covers and is in direct contact with the end surface B1 and the sidewalls B2 of the corresponding end portion 122b1, in accordance with some embodiments.

Each conductive structure 422a is similar to the conductive structure 422 of FIG. 4D, except that each conductive structure 422a wraps around the end portion 122b1 of the conductive via structure 122b thereover, in accordance with some embodiments. The end portion 122b1 extends into the conductive structure 422a thereunder, in accordance with some embodiments. Each conductive structure 422b is similar to or the same as the conductive structure 422 of FIG. 4D, in accordance with some embodiments.

As shown in FIG. 5B, the width W2 of the conductive via structure 122b at the same level of the surface 121a3 of the insulating layer 121a is less than the width W1 of the conductive via structure 122b adjacent to the conductive line 122a, in accordance with some embodiments. The width W1 is less than or equal to the width W422U of the conductive structure 422 adjacent to the conductive via structure 122b, in accordance with some embodiments.

The width W422U is less than the width W422L of the conductive structure 422a adjacent to the conductive bumps 240, in accordance with some embodiments. The W422L is less than or equal to the width W240 of the conductive bump 240, in accordance with some embodiments.

As shown in FIGS. 5A and 5C, the conductive structure 422a is wider than the conductive structure 422b, in accordance with some embodiments. The conductive structures 422a surround the conductive structures 422b, in accordance with some embodiments. The conductive structures 422a are over a peripheral region P of an electronic device 510, in accordance with some embodiments. The conductive structures 422b are over a central region C' of the electronic device 510, in accordance with some embodiments.

Since the circuit density of the central region C' is greater than the circuit density of the peripheral region P, the number density (or the distribution density) of the conductive structures 422b over the central region C' is greater than the number density of the conductive structures 422a over the peripheral region P, in accordance with some embodiments. The distance D422b between the conductive structures 422b is less than the distance D422a between the conductive structures 422a, in accordance with some embodiments.

Since the circuit density of the peripheral region P is low, the conductive structures 422a are able to have a greater width to increase the bonding area between the conductive structures 422a and the conductive bumps 240, which prevents the warpage of the electronic device 510, in accordance with some embodiments. The increase of the bonding area between the conductive structures 422a and the conductive bumps 240 increases the current flowing through the bonding area, which improves the performance of the package structure 200D, in accordance with some embodiments.

The package structure 200D includes the electronic device 510 in replace of the electronic devices 230A and 230B of the package structure 200C of FIG. 4D, in accordance with some embodiments. The electronic device 510 includes a main portion 512 and conductive pillars 514 and 516. The main portion 512 is similar to or substantially the same as the chip structures 130A and 130B or the electronic device 130C of FIG. 1L, in accordance with some embodiments.

The conductive pillars 514 and 516 are over and connected to the main portion 512, in accordance with some embodiments. The conductive pillars 514 electrically connect the main portion 512 to the conductive structures 422a, in accordance with some embodiments. The conductive pillars 516 electrically connect the main portion 512 to the conductive structures 422b, in accordance with some embodiments.

The conductive pillar 514 is wider than the conductive pillar 516, in accordance with some embodiments. The conductive pillars 514 and 516 are made of a conductive material, such as metal (e.g., copper, aluminum, gold, silver, or tungsten) or alloys thereof, in accordance with some embodiments.

Figure 6:
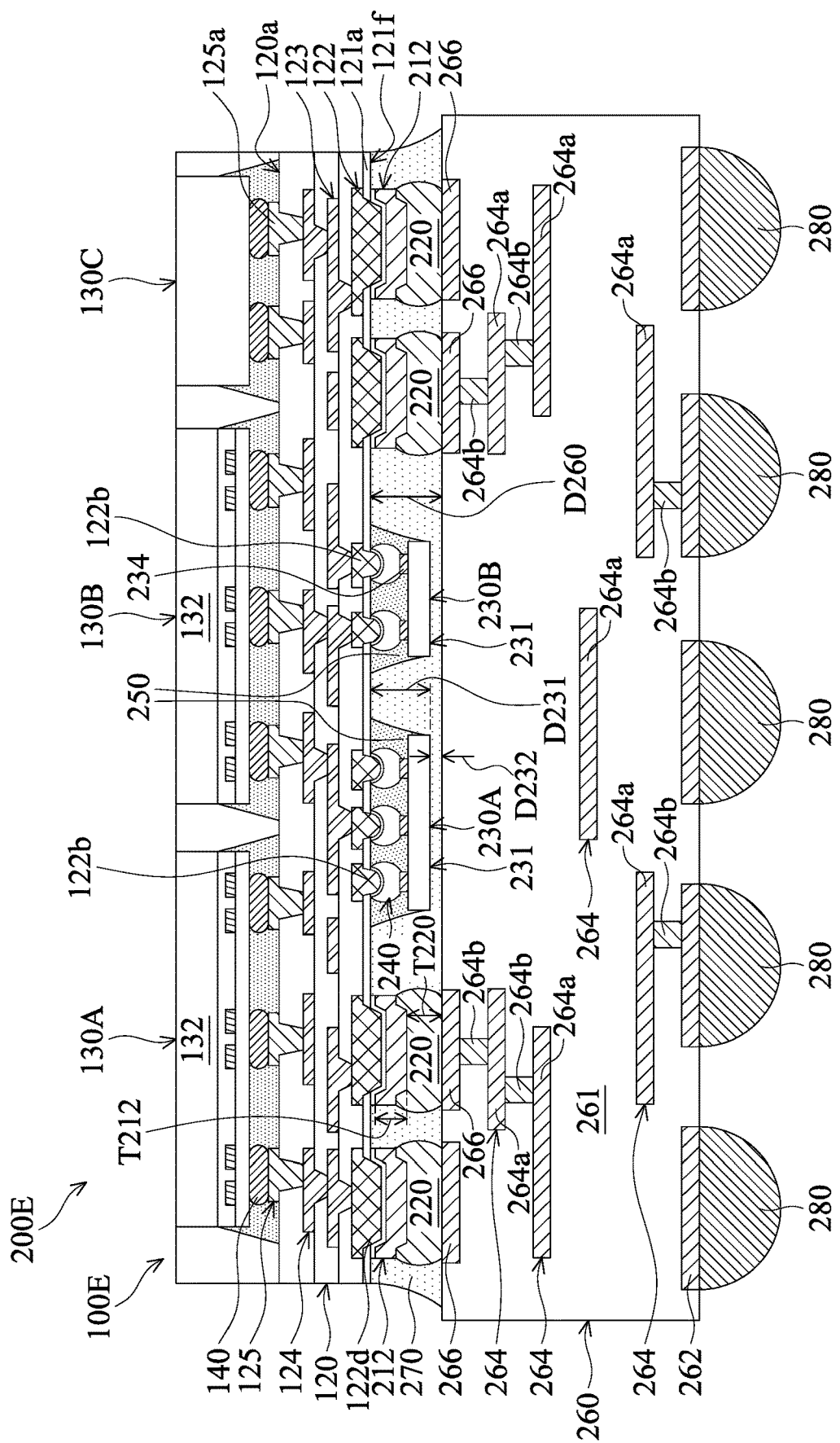
FIG. 6 is a cross-sectional view of a package structure, in accordance with some embodiments.

FIG. 6 is a cross-sectional view of a package structure 200E, in accordance with some embodiments. As shown in FIG. 6, the package structure 200E and the chip package 100E are respectively similar to the package structure 200 and the chip package 100 of FIG. 1L, except that the electronic devices 230A and 230B of the package structure 200E are not in the wiring substrate 260, in accordance with some embodiments.

The wiring substrate 260 of FIG. 6 does not have the recesses 267 and 268 of the wiring substrate 260 of FIG. 1L, in accordance with some embodiments. In some embodiments, a distance D231 between the surface 231 of the electronic device 230A or 230B and the insulating layer 121a is less than a distance D260 between the insulating layer 121a and the wiring substrate 260.

The distance D260 ranges from about 50 μm to about 200 μm, in accordance with some embodiments. A ratio of the thickness T212 of the conductive pillar 212 to the thickness T220 of the conductive bump 220 ranges from about 0.5 to about 5, in accordance with some embodiments.

The distance D231 ranges from about 90 μm to about 270 μm, in accordance with some embodiments. A distance D232 between the surface 231 and the wiring substrate 260 ranges from about 10 μm to about 30 μm, in accordance with some embodiments.

Processes and materials for forming the package structures 200A, 200B, 200C, 200D, and 200E and the chip packages 100A, 100B, 100C, 100D, and 100E may be similar to, or the same as, those for forming the package structure 200 and the chip package 100 described above.

In accordance with some embodiments, package structures and methods for forming the same are provided. The methods (for forming the package structure) bond conductive bumps to end portions of conductive via structures, not pads, which enables to form self-aligned and fine-pitch joints (or fine-pitch routings), which are able to achieve high I/O throughput. Therefore, the design flexibility is improved.

In accordance with some embodiments, a package structure is provided. The package structure includes an interposer substrate including an insulating structure, a conductive pad, a first conductive line, and a first conductive via structure. The insulating structure has a first surface and a second surface opposite to the first surface, the conductive pad is over the first surface, the first conductive line is in the insulating structure and electrically connected to the conductive pad, the first conductive via structure is partially in the insulating structure and connected to the first conductive line, a first end portion of the first conductive via structure protrudes from the second surface of the insulating structure, and a first width of the first conductive via structure decreases in a direction away from the first surface. The package structure includes an electronic device bonded to the conductive pad. The package structure includes a chip structure bonded to the first end portion of the first conductive via structure. The package structure includes a first conductive bump connected between the chip structure and the first end portion of the first conductive via structure. The first end portion protrudes into the first conductive bump and is in direct contact with the first conductive bump.

In accordance with some embodiments, a package structure is provided. The package structure includes an interposer substrate including an insulating structure, a conductive pad, a first conductive line, and a first conductive via structure. The insulating structure has a first surface and a second surface, the conductive pad is over the first surface, the first conductive line and the first conductive via structure are in the insulating structure and electrically connected to each other, a first end portion of the first conductive via structure protrudes from the second surface of the insulating structure, and a first width of the first conductive via structure decreases in a direction away from the first surface. The package structure includes a first electronic device bonded to the conductive pad. The package structure includes an insulating layer over the second surface of the insulating structure. The package structure includes a second electronic device over the insulating layer. The package structure includes a conductive structure connected between the second electronic device and the first end portion of the first conductive via structure and passing through the insulating layer. The conductive structure and the first conductive via structure together form a connect structure, and the connect structure has a sandglass shape in a cross-sectional view of the connect structure.

In accordance with some embodiments, a package structure is provided. The package structure includes an interposer substrate including an insulating structure, a conductive pad, and a conductive via structure. The insulating structure has a first surface and a second surface opposite to the first surface, the conductive pad is over the first surface, and the conductive via structure is partially in the insulating structure and electrically connected to the conductive pad. The package structure includes an electronic device bonded to the conductive pad. The package structure includes a chip structure bonded to the conductive via structure from the second surface of the insulating structure. The package structure includes a conductive bump connected between the chip structure and the conductive via structure. The conductive bump has a concave curved surface facing the conductive via structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   an interposer substrate comprising an insulating structure, a conductive pad, a first conductive line, and a first conductive via structure, wherein the insulating structure has a first surface and a second surface opposite to the first surface, the conductive pad is over the first surface, the first conductive line is in the insulating structure and electrically connected to the conductive pad, the first conductive via structure is partially in the insulating structure and connected to the first conductive line, a first end portion of the first conductive via structure protrudes from the second surface of the insulating structure, and a first width of the first conductive via structure decreases in a direction away from the first surface;
   an electronic device bonded to the conductive pad;
   a chip structure bonded to the first end portion of the first conductive via structure, wherein the first end portion of the first conductive via structure has a curved convex surface facing the chip structure; and
   a first conductive bump connected between the chip structure and the first end portion of the first conductive via structure, wherein the first end portion protrudes into the first conductive bump and is in direct contact with the first conductive bump.

2. The package structure as claimed in claim 1, wherein the insulating structure comprises a first insulating layer and a second insulating layer, the first conductive line is over the first insulating layer, the first conductive via structure passes through the first insulating layer, the second insulating layer is over the first insulating layer and the first conductive line, the conductive pad is over the second insulating layer, and the first insulating layer is thinner than the second insulating layer.

3. The package structure as claimed in claim 1, wherein the first conductive bump covers the entire first end portion of the first conductive via structure.

4. The package structure as claimed in claim 1, wherein the first conductive bump has a bulk portion and an alloy layer, the alloy layer is between the bulk portion and the first end portion of the first conductive via structure, the alloy layer comprises a first material of the bulk portion and a second material of the first conductive via structure, and the alloy layer has a curved surface.

5. The package structure as claimed in claim 1, wherein the interposer substrate further comprises a second conductive line and a second conductive via structure, the second conductive line is in the insulating structure and electrically connected to the conductive pad, the second conductive via structure is partially in the insulating structure and connected to the second conductive line, a second end portion of the second conductive via structure protrudes from the second surface of the insulating structure, a second width of the second conductive via structure decreases in the direction away from the first surface, and the second conductive via structure is wider than the first conductive via structure.

6. The package structure as claimed in claim 5, further comprising:
   a conductive pillar over the second end portion of the second conductive via structure; and
   a second conductive bump over the conductive pillar, wherein the second conductive bump is wider than the first conductive bump.

7. The package structure as claimed in claim 6, further comprising:
   a wiring substrate, wherein the second conductive bump is bonded to the wiring substrate, and the chip structure is between the interposer substrate and the wiring substrate.

8. The package structure as claimed in claim 7, wherein a portion of the chip structure is in the wiring substrate.

9. The package structure as claimed in claim 1, wherein the curved convex surface of the first end portion of the first conductive via structure has a semicircle shape in a cross-sectional view of the first conductive via structure.

10. A package structure, comprising:
    an interposer substrate comprising an insulating structure, a conductive pad, a first conductive line, a first conductive via structure, and a second conductive via structure, wherein the insulating structure has a first surface and a second surface, the conductive pad is over the first surface, the first conductive line, the first conductive via structure, and the second conductive via structure are in the insulating structure and electrically connected to each other, the second conductive via structure is over the first conductive via structure, the first conductive line is between the second conductive via structure and the first conductive via structure, an end portion of the first conductive via structure protrudes from the second surface of the insulating structure, and a top portion of the second conductive via structure is wider than the end portion of the first conductive via structure;
    a first electronic device bonded to the conductive pad;
    a second electronic device over the second surface of the insulating structure; and
    a conductive structure connected between the second electronic device and the end portion of the first conductive via structure, wherein the conductive structure and the first conductive via structure together form a connect structure, and the connect structure has a sandglass shape in a cross-sectional view of the connect structure.

11. The package structure as claimed in claim 10, wherein the conductive structure comprises a solder bump.

12. The package structure as claimed in claim 10, wherein the conductive structure comprises a conductive pillar, and the package structure further comprises a conductive bump connected between the conductive pillar and the second electronic device.

13. The package structure as claimed in claim 10, wherein the end portion of the first conductive via structure is in the conductive structure.

14. The package structure as claimed in claim 10, wherein the conductive structure has a curved surface facing the end portion of the conductive via structure.

15. A package structure, comprising:
an interposer substrate comprising an insulating structure, a conductive pad, and a conductive via structure, wherein the insulating structure has a first surface and a second surface opposite to the first surface, the conductive pad is over the first surface, and the conductive via structure is partially in the insulating structure and electrically connected to the conductive pad;
an electronic device bonded to the conductive pad;
a chip structure bonded to the conductive via structure from the second surface of the insulating structure; and
a conductive bump connected between the chip structure and the conductive via structure, wherein the conductive bump has a curved surface facing the first surface.

16. The package structure as claimed in claim 15, wherein the conductive via structure has a convex curved surface facing the curved surface of the conductive bump.

17. The package structure as claimed in claim 16, wherein the conductive bump comprises an alloy layer and a bulk portion, the alloy layer is between the conductive via structure and the bulk portion, and the alloy layer is made of a first material of the bulk portion and a second material of the conductive via structure.

18. The package structure as claimed in claim 17, wherein the alloy layer conformally covers the convex curved surface of the conductive via structure.

19. The package structure as claimed in claim 16, wherein the convex curved surface of the conductive via structure is in the conductive bump.

20. The package structure as claimed in claim 15, wherein the conductive bump is in direct contact with the conductive via structure.

* * * * *